(12) United States Patent
Zawodny et al.

(10) Patent No.: US 9,892,767 B2
(45) Date of Patent: Feb. 13, 2018

(54) DATA GATHERING IN MEMORY

(71) Applicant: Micron Technology, Inc., Boise, ID (US)

(72) Inventors: Jason T. Zawodny, Eagle, ID (US); Sanjay Tiwari, Meridian, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/043,236

(22) Filed: Feb. 12, 2016

(65) Prior Publication Data

US 2017/0236564 A1    Aug. 17, 2017

(51) Int. Cl.
G11C 5/06  (2006.01)
G11C 7/10  (2006.01)

(52) U.S. Cl.
CPC .............. *G11C 7/1012* (2013.01); *G11C 5/06* (2013.01)

(58) Field of Classification Search
None
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,852,065 A | 7/1989 | Baddiley | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,079,739 A | 1/1992 | Petersen | |
| 5,201,039 A | 4/1993 | Sakamura | |
| 5,210,850 A | 5/1993 | Kelly et al. | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Uyen B Tran
(74) *Attorney, Agent, or Firm* — Brooks, Cameron & Huebsch, PLLC

(57) ABSTRACT

Examples of the present disclosure provide apparatuses and methods for storing a first element in memory cells coupled to a first sense line and a plurality of access line. The examples can include storing a second element in memory cells coupled to a second sense line and the plurality of access lines. The memory cells coupled to the first sense line can be separated from the memory cells coupled to the second sense line by at least memory cells coupled to a third sense line and the plurality of access lines. The examples can include storing the second element in the memory cells coupled to the third sense line.

25 Claims, 16 Drawing Sheets

(56) References Cited

U.S. PATENT DOCUMENTS

| | | |
|---|---|---|
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,406,525 A * | 4/1995 | Nicholes ............ G11C 7/1006 365/189.02 |
| 5,430,687 A | 7/1995 | Hung et al. |
| 5,440,482 A | 8/1995 | Davis |
| 5,446,690 A | 8/1995 | Tanaka et al. |
| 5,449,907 A | 9/1995 | McKeeman et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,606,707 A | 2/1997 | Tomassi et al. |
| 5,615,404 A | 3/1997 | Knoll et al. |
| 5,638,128 A | 6/1997 | Hoogenboom et al. |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,740,340 A | 4/1998 | Purcell et al. |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,954,831 A * | 9/1999 | Chang .................... G11C 29/10 365/201 |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,411,333 B1 | 6/2002 | Auld et al. |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard, Jr. |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,546,516 B2 * | 6/2009 | Helbig, Sr. ............ H03M 13/17 714/762 |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,907,473 B2 | 3/2011 | Ishizaki et al. |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,437,217 B2 | 5/2013 | Pekny |
| 8,447,962 B2 | 5/2013 | Hughes et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |

(56) References Cited

U.S. PATENT DOCUMENTS

| | | |
|---|---|---|
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,688,962 B2 | 4/2014 | Raikin et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0036801 A1* | 2/2006 | Jones .......... G06F 12/0207 711/101 |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0241405 A1 | 10/2007 | Popoff |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1* | 12/2010 | Noda .......... G11C 7/1006 326/10 |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0040596 A1 | 2/2014 | Fleischer et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0085589 A1 | 3/2015 | Lu et al. |
| 2015/0089166 A1 | 3/2015 | Kogge |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |

(56) References Cited

FOREIGN PATENT DOCUMENTS

| TW | 201218070 | 5/2012 |
|----|-----------|--------|
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, mailed Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Warren Jr., Henry S., "Hacker's Delight", Second Edition, Oct. 2013, pp. 181-184 and 194.

International Search Report and Written Opinion for related PCT Application No. PCT/US2017/016425, dated May 25, 2017, 14 pages.

Office Action for related Taiwan Patent Application No. 106104347, dated Oct. 6, 2017, 11 pages.

* cited by examiner

|  | 305-0 | 305-1 | 305-2 | 305-3 | 305-4 | 305-5 | 305-6 | 305-7 | 305-8 | 305-9 | 305-10 | 305-11 | 305-12 | 305-13 | 305-14 | 305-15 |
|---|---|---|---|---|---|---|---|---|---|---|---|---|---|---|---|---|
| 304-0 | 1 | X | X | X | X | X | X | X | 0 | X | X | X | X | X | X | X |
| 304-1 | 1 | X | X | X | X | X | X | X | 0 | X | X | X | X | X | X | X |
| 304-2 | 1 | X | X | X | X | X | X | X | 0 | X | X | X | X | X | X | X |
| 304-3 | 1 | X | X | X | X | X | X | X | 0 | X | X | X | X | X | X | X |
| 304-4 | 1 | X | X | X | X | X | X | X | 0 | X | X | X | X | X | X | X |
| 304-5 | 1 | X | X | X | X | X | X | X | 0 | X | X | X | X | X | X | X |
| 304-6 | 1 | X | X | X | X | X | X | X | 0 | X | X | X | X | X | X | X |
| 304-7 | 1 | X | X | X | X | X | X | X | 0 | X | X | X | X | X | X | X |
| 304-8 | 1 | X | X | X | X | X | X | X | 1 | X | X | X | X | X | X | X |
| 304-9 | 1 | X | X | X | X | X | X | X | 1 | X | X | X | X | X | X | X |
| 304-10 | 1 | X | X | X | X | X | X | X | 1 | X | X | X | X | X | X | X |
| 304-11 | 1 | X | X | X | X | X | X | X | 1 | X | X | X | X | X | X | X |
| 304-12 | 0 | X | X | X | X | X | X | X | 0 | X | X | X | X | X | X | X |
| 304-13 | 0 | X | X | X | X | X | X | X | 0 | X | X | X | X | X | X | X |
| 304-14 | 0 | X | X | X | X | X | X | X | 0 | X | X | X | X | X | X | X |
| 304-15 | 0 | X | X | X | X | X | X | X | 0 | X | X | X | X | X | X | X |

*Fig. 3B*

|  | 305-0 | 305-1 | 305-2 | 305-3 | 305-4 | 305-5 | 305-6 | 305-7 | 305-8 | 305-9 | 305-10 | 305-11 | 305-12 | 305-13 | 305-14 | 305-15 |
|---|---|---|---|---|---|---|---|---|---|---|---|---|---|---|---|---|
| 304-0 | 1 | 0 | X | X | X | X | X | X | X | X | X | X | X | X | X | X |
| 304-1 | 1 | 0 | X | X | X | X | X | X | X | X | X | X | X | X | X | X |
| 304-2 | 1 | 0 | X | X | X | X | X | X | X | X | X | X | X | X | X | X |
| 304-3 | 1 | 0 | X | X | X | X | X | X | X | X | X | X | X | X | X | X |
| 304-4 | 1 | 0 | X | X | X | X | X | X | X | X | X | X | X | X | X | X |
| 304-5 | 1 | 0 | X | X | X | X | X | X | X | X | X | X | X | X | X | X |
| 304-6 | 1 | 0 | X | X | X | X | X | X | X | X | X | X | X | X | X | X |
| 304-7 | 1 | 0 | X | X | X | X | X | X | X | X | X | X | X | X | X | X |
| 304-8 | X | X | X | X | X | X | X | X | 1 | 1 | X | X | X | X | X | X |
| 304-9 | X | X | X | X | X | X | X | X | 1 | 1 | X | X | X | X | X | X |
| 304-10 | X | X | X | X | X | X | X | X | 1 | 1 | X | X | X | X | X | X |
| 304-11 | X | X | X | X | X | X | X | X | 1 | 1 | X | X | X | X | X | X |
| 304-12 | X | X | X | X | X | X | X | X | 0 | 0 | X | X | X | X | X | X |
| 304-13 | X | X | X | X | X | X | X | X | 0 | 0 | X | X | X | X | X | X |
| 304-14 | X | X | X | X | X | X | X | X | 0 | 0 | X | X | X | X | X | X |
| 304-15 | X | X | X | X | X | X | X | X | 0 | 0 | X | X | X | X | X | X |

*Fig. 3C*

|  | COMP_COMP | TMPLOOKUP | TMPELEM | ELEM_MASK | DEST |
|---|---|---|---|---|---|
| 451-0 | 0X00,00,00,00 | 0X00,00,00,00 | 0X00,00,00,00 | 0X00,00,00,00 | 0X88,88,88,88 |
| 451-1 | 0X80,00,00,00 | 0X00,00,00,00 | 0X00,00,00,00 | 0X00,00,00,00 | 0X88,88,88,88 |
| 451-2 | 0X08,00,00,00 | 0X00,00,00,00 | 0X00,00,00,00 | 0X00,00,00,00 | 0X88,88,88,88 |
| 451-3 | 0X08,00,00,00 | 0X08,00,00,00 | 0X00,00,00,00 | 0X08,00,00,00 | 0X88,88,88,88 |
| 451-4.1a | 0X08,00,00,00 | 0X08,00,00,00 | 0X00,00,00,00 | 0X08,00,00,00 | 0X88,88,88,88 |
| 451-4.1b | 0X08,00,00,00 | 0X08,00,00,00 | 0X00,00,00,00 | 0X08,00,00,00 | 0X88,88,88,88 |
| 451-4.1c | 0X40,00,00,00 | 0X08,00,00,00 | 0X00,00,00,00 | 0X08,00,00,00 | 0X88,88,88,88 |
| 451-4.1d | 0X40,00,00,00 | 0X08,00,00,00 | 0X40,00,00,00 | 0X08,00,00,00 | 0X88,88,88,88 |
| 451-4.1e | 0XF7,FF,FF,FF | 0X08,00,00,00 | 0X40,00,00,00 | 0X08,00,00,00 | 0X88,88,88,88 |
| 451-4.1f | 0X80,88,88,88 | 0X08,00,00,00 | 0X40,00,00,00 | 0X08,00,00,00 | 0X88,88,88,88 |
| 451-4.1g | 0XC0,88,88,88 | 0X08,00,00,00 | 0X40,00,00,00 | 0X08,00,00,00 | 0X88,88,88,88 |
| 451-4.1h | 0XC0,88,88,88 | 0X08,00,00,00 | 0X40,00,00,00 | 0X08,00,00,00 | 0XC0,88,88,88 |
| 451-4.1i | 0X08,00,00,00 | 0X08,00,00,00 | 0X40,00,00,00 | 0X08,00,00,00 | 0XC0,88,88,88 |
| 451-4.1j | 0X00,80,00,00 | 0X08,00,00,00 | 0X40,00,00,00 | 0X08,00,00,00 | 0XC0,88,88,88 |
| 451-4.1k | 0X00,80,00,00 | 0X00,80,00,00 | 0X40,00,00,00 | 0X08,00,00,00 | 0XC0,88,88,88 |
| 451-4.2a | 0X00,80,00,00 | 0X00,80,00,00 | 0X40,00,00,00 | 0X08,00,00,00 | 0XC0,88,88,88 |
| 451-4.2b | 0X00,80,00,00 | 0X00,80,00,00 | 0X40,00,00,00 | 0X08,00,00,00 | 0XC0,88,88,88 |
| 451-4.2c | 0X20,00,00,00 | 0X00,80,00,00 | 0X40,00,00,00 | 0X08,00,00,00 | 0XC0,88,88,88 |
| 451-4.2d | 0X20,00,00,00 | 0X00,80,00,00 | 0X20,00,00,00 | 0X08,00,00,00 | 0XC0,88,88,88 |
| 451-4.2e | 0XFF,7F,FF,FF | 0X00,80,00,00 | 0X20,00,00,00 | 0X08,00,00,00 | 0XC0,88,88,88 |
| 451-4.2f | 0XC0,08,88,88 | 0X00,80,00,00 | 0X20,00,00,00 | 0X08,00,00,00 | 0XC0,88,88,88 |
| 451-4.2g | 0XE0,08,88,88 | 0X00,80,00,00 | 0X20,00,00,00 | 0X08,00,00,00 | 0XC0,88,88,88 |
| 451-4.2h | 0XE0,08,88,88 | 0X00,80,00,00 | 0X20,00,00,00 | 0X08,00,00,00 | 0XE0,08,88,88 |
| 451-4.2i | 0X00,80,00,00 | 0X00,80,00,00 | 0X20,00,00,00 | 0X08,00,00,00 | 0XE0,08,88,88 |
| 451-4.2j | 0X00,08,00,00 | 0X00,80,00,00 | 0X20,00,00,00 | 0X08,00,00,00 | 0XE0,08,88,88 |
| 451-4.2k | 0X00,08,00,00 | 0X00,08,00,00 | 0X20,00,00,00 | 0X08,00,00,00 | 0XE0,08,88,88 |

*Fig. 4*

|  | | 431 | 433 | 435 | 437 | 439 |
|---|---|---|---|---|---|---|
|  | | COMP_COMP | TMPLOOKUP | TMPELEM | ELEM_MASK | DEST |
| 451-4.3 | | 0X00,00,80,00 | 0X00,00,80,00 | 0X10,00,00,00 | 0X08,00,00,00 | 0XF0,00,88,88 |
| 451-4.4 | | 0X00,00,08,00 | 0X00,00,08,00 | 0X08,00,00,00 | 0X08,00,00,00 | 0XF8,00,08,88 |
| 451-4.5 | | 0X00,00,00,80 | 0X00,00,00,80 | 0X04,00,00,00 | 0X08,00,00,00 | 0XFC,00,00,88 |
| 451-4.6 | | 0X00,00,00,08 | 0X00,00,00,08 | 0X02,00,00,00 | 0X08,00,00,00 | 0XFE,00,00,08 |
| 451-4.7 | 451-4.7a | 0X00,00,00,08 | 0X00,00,00,08 | 0X02,00,00,00 | 0X08,00,00,00 | 0XFE,00,00,08 |
|  | 451-4.7b | 0X00,00,00,08 | 0X00,00,00,08 | 0X02,00,00,00 | 0X08,00,00,00 | 0XFE,00,00,08 |
|  | 451-4.7c | 0X01,00,00,00 | 0X00,00,00,08 | 0X02,00,00,00 | 0X08,00,00,00 | 0XFE,00,00,08 |
|  | 451-4.7d | 0X01,00,00,00 | 0X00,00,00,08 | 0X01,00,00,00 | 0X08,00,00,00 | 0XFE,00,00,08 |
|  | 451-4.7e | 0XFF,7F,FF,F7 | 0X00,00,00,08 | 0X01,00,00,00 | 0X08,00,00,00 | 0XFE,00,00,08 |
|  | 451-4.7f | 0XFE,00,00,00 | 0X00,00,00,08 | 0X01,00,00,00 | 0X08,00,00,00 | 0XFE,00,00,08 |
|  | 451-4.7g | 0XFF,00,00,00 | 0X00,00,00,08 | 0X01,00,00,00 | 0X08,00,00,00 | 0XFE,00,00,08 |
|  | 451-4.7h | 0XFF,00,00,00 | 0X00,00,00,08 | 0X01,00,00,00 | 0X08,00,00,00 | 0XFF,00,00,00 |
|  | 451-4.7i | 0X00,00,00,08 | 0X00,00,00,08 | 0X01,00,00,00 | 0X08,00,00,00 | 0XFF,00,00,00 |
|  | 451-4.7j | 0X00,00,00,00 | 0X00,00,00,08 | 0X01,00,00,00 | 0X08,00,00,00 | 0XFF,00,00,00 |
|  | 451-4.7k | 0X00,00,00,00 | 0X00,00,00,00 | 0X01,00,00,00 | 0X08,00,00,00 | 0XFF,00,00,00 |
| 451-4.8 | | 0X00,00,00,00 | 0X00,00,00,00 | 0X00,00,00,00 | 0X08,00,00,00 | 0XFF,00,00,00 |

*Fig. 4 (cont)*

DATA GATHERING IN MEMORY

TECHNICAL FIELD

The present disclosure relates generally to semiconductor memory apparatuses and methods, and more particularly, to apparatuses and methods related to performing gathering operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIGS. 3A-3C each illustrate a schematic diagram of a portion of a memory array in accordance with a number of embodiments of the present disclosure.

FIG. 4 illustrates a table showing the states of memory cells of an array at a particular phase associated with performing a gathering operation in accordance with a number of embodiments of the present disclosure.

DETAILED DESCRIPTION

Figure 1:
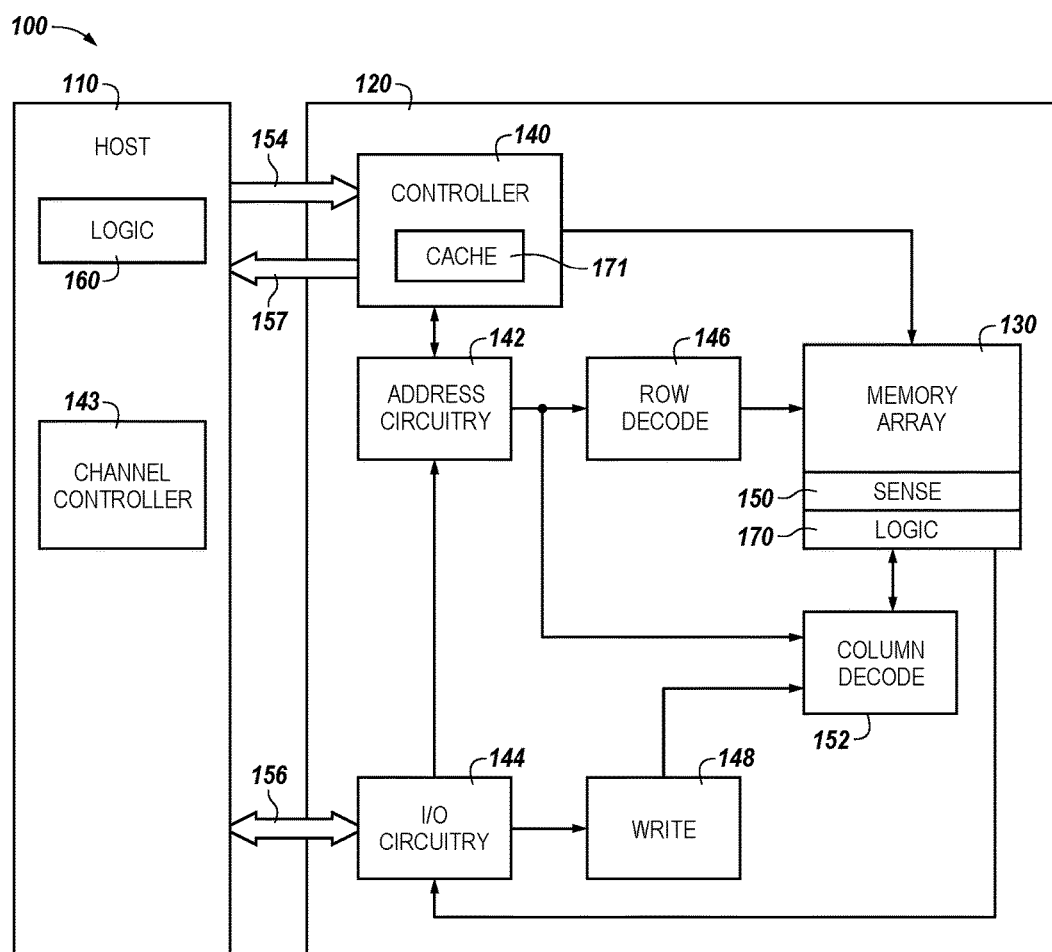
FIG. 1 is a block diagram of an apparatus in the form of a computing system including a memory device in accordance with a number of embodiments of the present disclosure.

The present disclosure includes apparatuses and methods related to gathering operations in memory. A gathering operation can be performed on a number of non-contiguous vectors of data stored in a memory array. Each vector can be stored in memory cells coupled to a sense line and a plurality of access lines. Each vector can be separated by at least one sense line from a neighboring vector. The vectors can be reorganized such that the number of vectors are stored in a contiguous manner (e.g., without a sense line separating each of the vectors from the corresponding neighboring vector). As used herein, contiguous refers to two vectors being stored next to or in sequence with each other. For example, a vector in a first column is stored next to a vector in a second column where the first column and the second column are in consecutive columns. The data can be vectors stored in a vertical fashion in the array such that memory cells storing each of the vectors are coupled to a same sense line and to a number of access lines vertically along a column of memory cells. Each vector can be separated by an additional number of vertical cells in adjacent columns that do not store a vector. For example, vectors are separated by columns of cells that do not store vectors, resulting in vectors being stored vertically in a horizontally non-contiguous manner. For example, horizontally non-contiguous, as used herein, refers to vectors being stored in columns (e.g., vertically) of cells that are not consecutive (in reference to horizontal spacing) and/or not next to one another horizontally. A gathering operation can include reorganizing the number of vertical vectors to be stored horizontally contiguous in the array, thereby eliminating adjacent columns of memory cells without stored vectors between the columns of memory cells storing vectors. The gathering operation can result in the vertical vectors being stored in a horizontally contiguous manner. For example, vectors stored vertically in columns of cells are stored next to one another such that the vectors are stored consecutively along the memory cells in a horizontal direction. The gathering operation can include a number of AND operations, OR operations, SHIFT operations, and INVERT operations performed without transferring data via an input/output (I/O) line.

As used herein, a vector can be an element. An element can, in a number of embodiments, be numerical values that can be stored in memory as bit-vectors. For example, a first element (e.g., a first operand) having a first value and stored as a first bit-vector can be stored in a number of memory cells vertically in the memory array. A second element (e.g., a second operand) having a second value and stored as a second bit-vector can be stored in an additional number of memory cells vertically in a different column of the memory array.

In a number of examples, an element can represent an object and/or other construct, which may be stored in memory as a bit-vector. As an example, a gathering operation can be performed to organize the bit-vectors that represent the respective objects such that they are stored closer to one another (e.g., adjacent or in sequential order) than they would be as compared to previous data organizing approaches.

A number of embodiments of the present disclosure can provide a reduction of the number of computations and/or time involved in performing a number of gathering operations (e.g., gathering functions) relative to previous approaches. For instance, the number of computations and/or the time can be reduced due to an ability to perform various portions of the number of gathering operations in parallel (e.g., simultaneously). Performing a number of gathering operations as described herein can also reduce power consumption as compared to previous approaches. In accordance with a number of embodiments, a gathering operation can be performed on elements (e.g., data in the form of bit-vectors stored in an array) without transferring data out of the memory array and/or sensing circuitry via a bus (e.g., data bus, address bus, control bus, etc.). A gathering operation can involve performing a number of operations (e.g., AND operations, OR operations, SHIFT operations, INVERT operations, and Block_OR operations, etc.). However, embodiments are not limited to these examples.

In various previous approaches, elements (e.g., a first value and a second value) to be gathered may have been transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single gather function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU). For example, moving the data from the memory array to the processing resource can include performing a sense line address access (e.g., firing of a column decode signal) in order to transfer data from sense lines onto I/O lines, moving the data to the array periphery, and providing the data to a register in association with performing a gather operation, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3A. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, and logic circuitry 170 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a bus 156 (e.g., an I/O bus) through I/O circuitry 144. Status and/or exception information can be provided from the controller 140 on the memory device 120 to a channel controller 143 (e.g., via a high speed interface (HSI) that can include an out-of-band bus 157. Address signals are received through address circuitry 142 and decoded by a row decoder 146 and a column decoder 152 to access the memory array 130. The address signals can also be provided to controller 140 (e.g., via address circuitry 142 and/or via a control bus 154). Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130. Cache 171 can be used to store data associated with the controller 140.

Controller 140, which may be referred to as bank control logic and/or a sequencer, decodes signals provided by control bus 154 from the host 110 and/or channel controller 143. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The memory controller 140 can be a state machine, a sequencer, or some other type of controller. The controller 140 can control shifting data (e.g., right or left) in an array (e.g., memory array 130), as well as gathering data in accordance with a number of embodiments described herein.

Examples of the sensing circuitry 150 can comprise a number of sensing components that each may comprise a sense amplifier and a corresponding compute component, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various operations (e.g., a number of logical operations that may be performed as part of a compute function, such as a function for determining a result of a mathematical computation), can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store (e.g., cache and/or buffer), results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, sensing circuitry (e.g., 150) can be used to perform logical operations without enabling column decode lines of the array; however, the local I/O line(s) may be enabled in order to transfer a result to a suitable location other than back to the array 130 (e.g., to an external register).

Figure 2A:
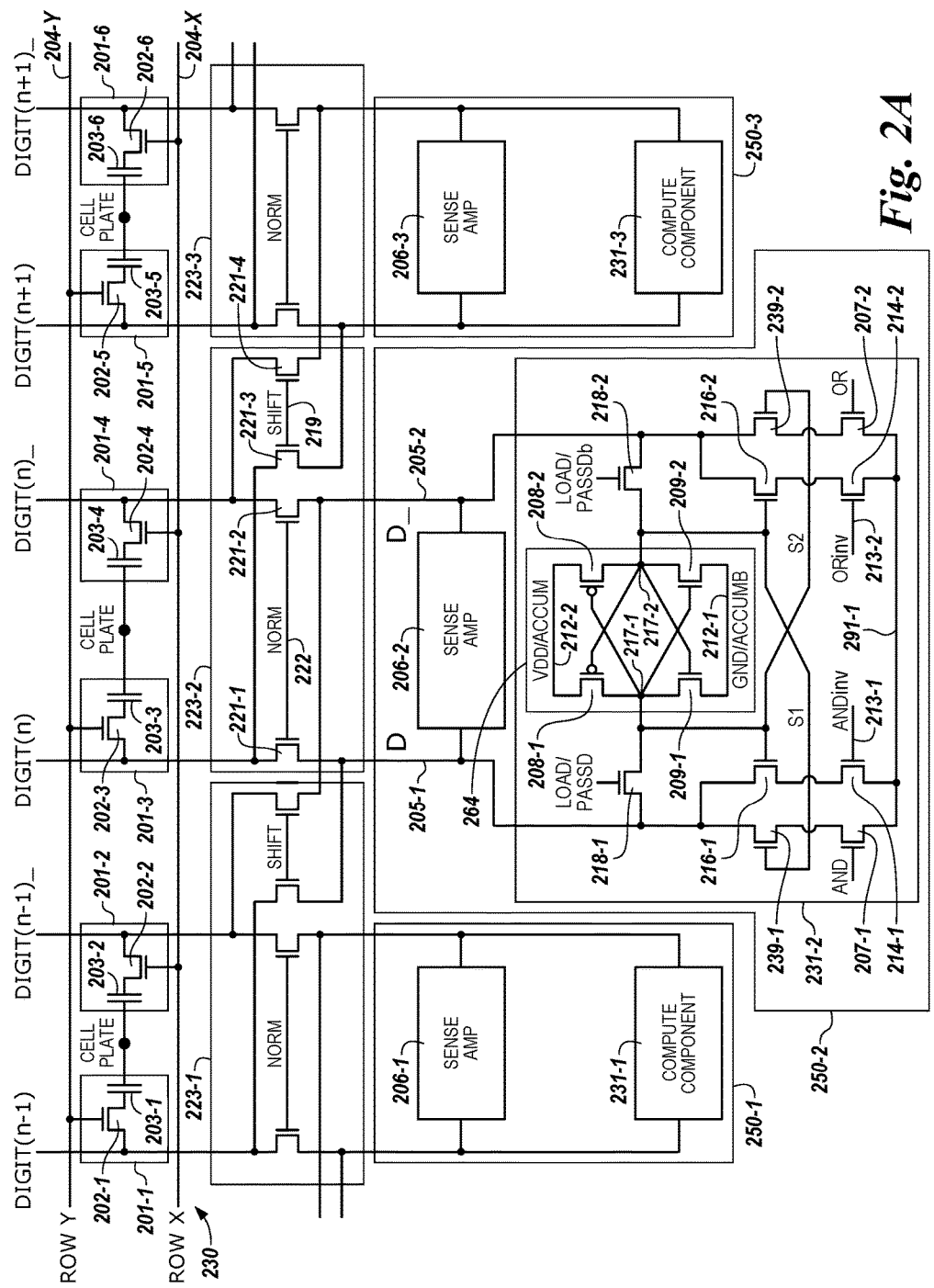
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell (e.g., one of memory cells 201-1, 201-2, 201-3, 201-4, 201-5, 201-6) comprises a storage element (e.g., one of corresponding capacitors 203-1 to 203-6) and an access device (e.g., one of corresponding transistors 202-1 to 202-6). For instance, memory cell 201-3 comprises transistor 202-3 and capacitor 203-3, memory cell 201-4 comprises transistor 202-4 and capacitor 203-4, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. The pair of complementary data lines can be referred to as a column. For example, referring to a column can refer to complementary sense lines such as D 205-1 and D_ 205-2 being included when referring to a "column." Although only three pair of complementary data lines are shown in FIG. 2A (e.g., three "columns"), embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry comprising a number of sensing components 250-1, 250-2, 250-3, etc., in accordance with a number of embodiments of the present disclosure. Each sensing component comprises a sense amplifier and a corresponding compute component corresponding to respective columns of memory cells (e.g., coupled to respective pairs of complementary data lines). The sensing circuitry can comprise a number of elements, but it at least includes a sense amp and corresponding compute component per column (e.g., the two complementary sense lines in reference to a column) of the array. In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B. The compute components of array 230 can be referred to generally as compute components 231 and the sense amplifiers of array 230 can be referred to generally as sense amplifiers 206.

In the example illustrated in FIG. 2A, the circuitry corresponding to compute component 231-2 comprises a static latch 264 and an additional number of (e.g., ten) transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch 264 of the compute components 231 can be referred to herein as a secondary latch, which can serve as an accumulator. As such, the compute components 231 can operate as and/or be referred to herein as an accumulator. Each of the compute components 231 can be coupled to a pair of complementary data lines (e.g., D 205-1 and D_205-2) as shown in FIG. 2A. The transistors of compute components (e.g., 231-2) can all be n-channel transistors (e.g., NMOS transistors), for example. However, embodiments are not limited to this example.

In this example, data line D 205-1 is coupled to a first source/drain region of transistors 216-1 and 239-1, as well as to a first source/drain region of load/pass transistor 218-1. Data line D_205-2 is coupled to a first source/drain region of transistors 216-2 and 239-2, as well as to a first source/drain region of load/pass transistor 218-2.

The gates of load/pass transistor 218-1 and 218-2 are commonly coupled to a LOAD control signal, or respectively coupled to a PASSD/PASSDB control signal, as discussed further below. A second source/drain region of load/pass transistor 218-1 is directly coupled to the gates of transistors 216-1 and 239-2. A second source/drain region of load/pass transistor 218-2 is directly coupled to the gates of transistors 216-2 and 239-1.

A second source/drain region of transistor 216-1 is directly coupled to a first source/drain region of pull-down transistor 214-1. A second source/drain region of transistor 239-1 is directly coupled to a first source/drain region of pull-down transistor 207-1. A second source/drain region of transistor 216-2 is directly coupled to a first source/drain region of pull-down transistor 214-2. A second source/drain region of transistor 239-2 is directly coupled to a first source/drain region of pull-down transistor 207-2. A second source/drain region of each of pull-down transistors 207-1, 207-2, 214-1, and 214-2 is commonly coupled together to a reference voltage (e.g., ground (GND) 291-1). A gate of pull-down transistor 207-1 is coupled to an AND control signal line, a gate of pull-down transistor 214-1 is coupled to an ANDinv control signal line 213-1, a gate of pull-down transistor 214-2 is coupled to an ORinv control signal line 213-2, and a gate of pull-down transistor 207-2 is coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating a LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each have a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors. As used herein, configuration is intended to mean size, doping level, and transition type.

Load transistors can be configured (e.g., can be sized, doped, etc.) to handle loading specifications associated with coupling data lines to the local dynamic nodes S1 and S2, for example. Pass transistors, however, can be configured to handle heavier loading associated with coupling data lines to an adjacent accumulator (e.g., through the adjacent compute component 231-3 and shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. For example, load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute components (e.g., 231-2, including the latch 264) can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_205-2 through load/pass transistors 218-1 and 218-2. However, embodiments are not limited to this configuration. The latch 264 can be a cross coupled latch. For example, the gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2. As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
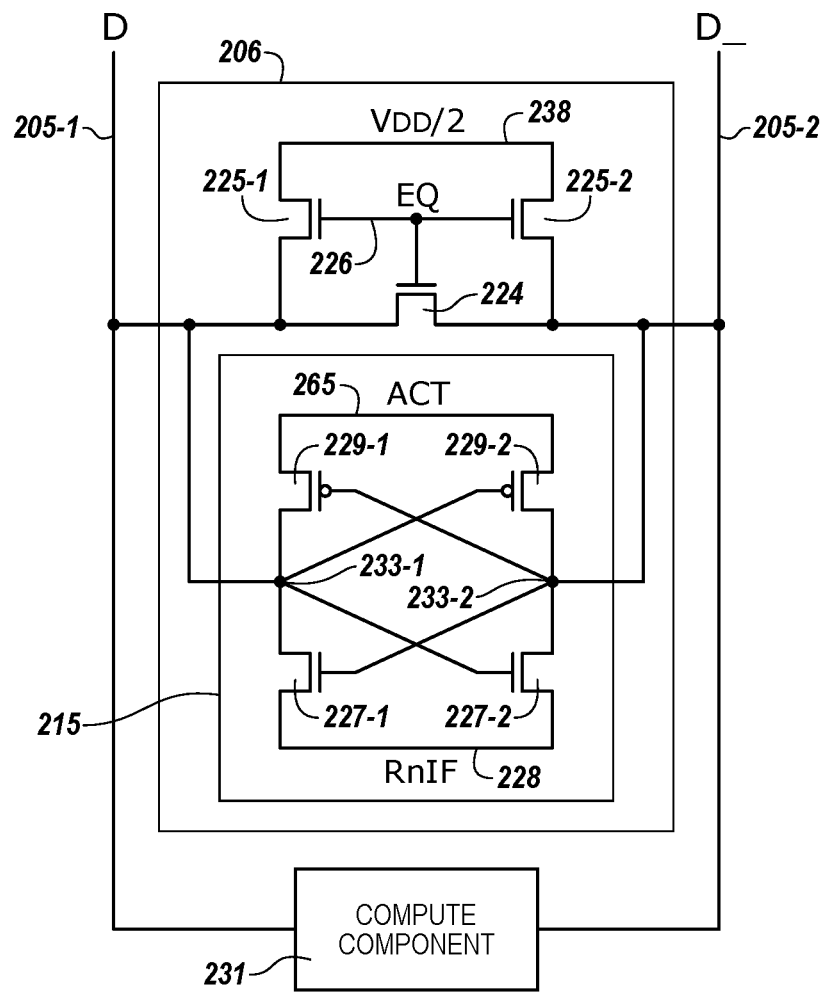
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In some examples, the sensing circuitry can include shifting circuitry, such as shifting circuitry 223-1, 223-2, and 223-3, as shown in FIG. 2A and referred to generally as shifting circuitry 223. In this example, the shift circuitry 223 comprises a pair of isolation devices coupled to respective data lines of a complementary data line pair (e.g., isolation transistors 221-1 and 221-2 of shifting circuitry 223-2 are coupled to data lines 205-1 (D) and 205-2 (D_), respectively). In this example, the isolation transistors (e.g., 221-1 and 221-2) are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_), and compute component 231-6 corresponding to DIGIT(n−1) and DIGIT(n−1) illustrated on the left complementary pair of sense lines and compute component 231-6 corresponding to DIGIT (n+1) and DIGIT(n+1) illustrated on the right complementary pair of sense lines). According to various embodiments, conduction of the isolation transistors (e.g., 221-1 and 221-2) can be referred to as a "normal" configuration of the shift circuitry 223.

In the example illustrated in FIG. 2A, the shift circuitry 223 includes another (e.g., a second) pair of isolation devices coupled to a complementary control signal (e.g., shift circuitry 223-2 includes isolation transistors 221-3 and 221-4 coupled to complementary control signal 219 (SHIFT)), which can be activated, for example, when NORM 222 is deactivated. The isolation transistors (e.g., 221-3 and 221-4) can be operated (e.g., via control signal 219) such that a particular sense amplifier (e.g., 206-2) and compute component (e.g., 231-2) are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223 can be arranged as a portion of (e.g., within) a corresponding sense amplifier 206, for instance.

Although the shift circuitry 223-2 shown in FIG. 2A includes isolation transistors 221-1 and 221-2 used to couple particular a particular sensing component 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing component 250-2 to an adjacent pair of complementary data lines in one particular direction (e.g., adjacent data lines DIGIT(n+1) and DIGIT(n+1) shown to the right in FIG. 2A), embodiments of the present disclosure are not so limited. For instance, shift circuitry 223 can include isolation transistors (e.g., 221-1 and 221-2) used to couple particular sensing circuitry to a particular pair of complementary data lines (e.g., DIGIT(n) and DIGIT(n)) and isolation transistors (e.g., 221-3 and 221-4) arranged so as to be used to couple a particular sensing component (e.g., 250-2) to an adjacent pair of complementary data lines in another particular direction (e.g., adjacent data lines DIGIT(n−1) and DIGIT (n−1)_).

Embodiments of the present disclosure are not limited to the configuration of shift circuitry shown in FIG. 2A. For example, determining whether to shift in a particular direction to perform a shift operation is independent of the circuitry implementation. In a number of embodiments, shift circuitry such as that shown in FIG. 2A (e.g., shift circuitry 223) can be operated (e.g., in conjunction with corresponding sensing components 250) in association with performing mathematical operations such as adding and subtracting operations without transferring data out of the sensing circuitry via an I/O line (e.g., local I/O line (IO/IO_)), for instance.

Although not shown in FIG. 2A, each column of memory cells can be coupled to a column decode line that can be activated to transfer, via a local I/O line (e.g., I/O line 334 in FIG. 3A), a data value from a corresponding sense amplifier 206 and/or compute component 231 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform logical operations without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206-2 shown in FIG. 2A) can comprise a number of transistors formed on pitch with the transistors of a corresponding compute component (e.g., 231-2 shown in FIG. 2A) and/or the memory cells of an array (e.g., 230 shown in FIG. 2A) to which they are coupled, which may conform to a particular feature size (e.g., $4F^2$, $6F^2$, etc.). Sense amplifier 206 shown in FIG. 2B comprises a latch 215 including four transistors coupled to a pair of complementary data lines D 205-1 and D_205-2. The latch 215 can be a cross coupled latch. For example, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231 shown in FIG. 2AB can be a compute component such as compute component 231-2 shown in FIG. 2A.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$ where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and corresponding compute component 231, and the result can be stored in the sense amplifier and/or compute component.

In a number of embodiments, sensing circuitry, such as a sensing component comprising sense amplifier 206 and compute component 231, can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry can be operated in both pre-sensing (e.g., sense amps fired before logical operation control signal active) and post-sensing (e.g., sense amps fired after logical operation control signal active) modes with a result of a logical operation being initially stored in the sense amplifier 206.

Figure 3A:
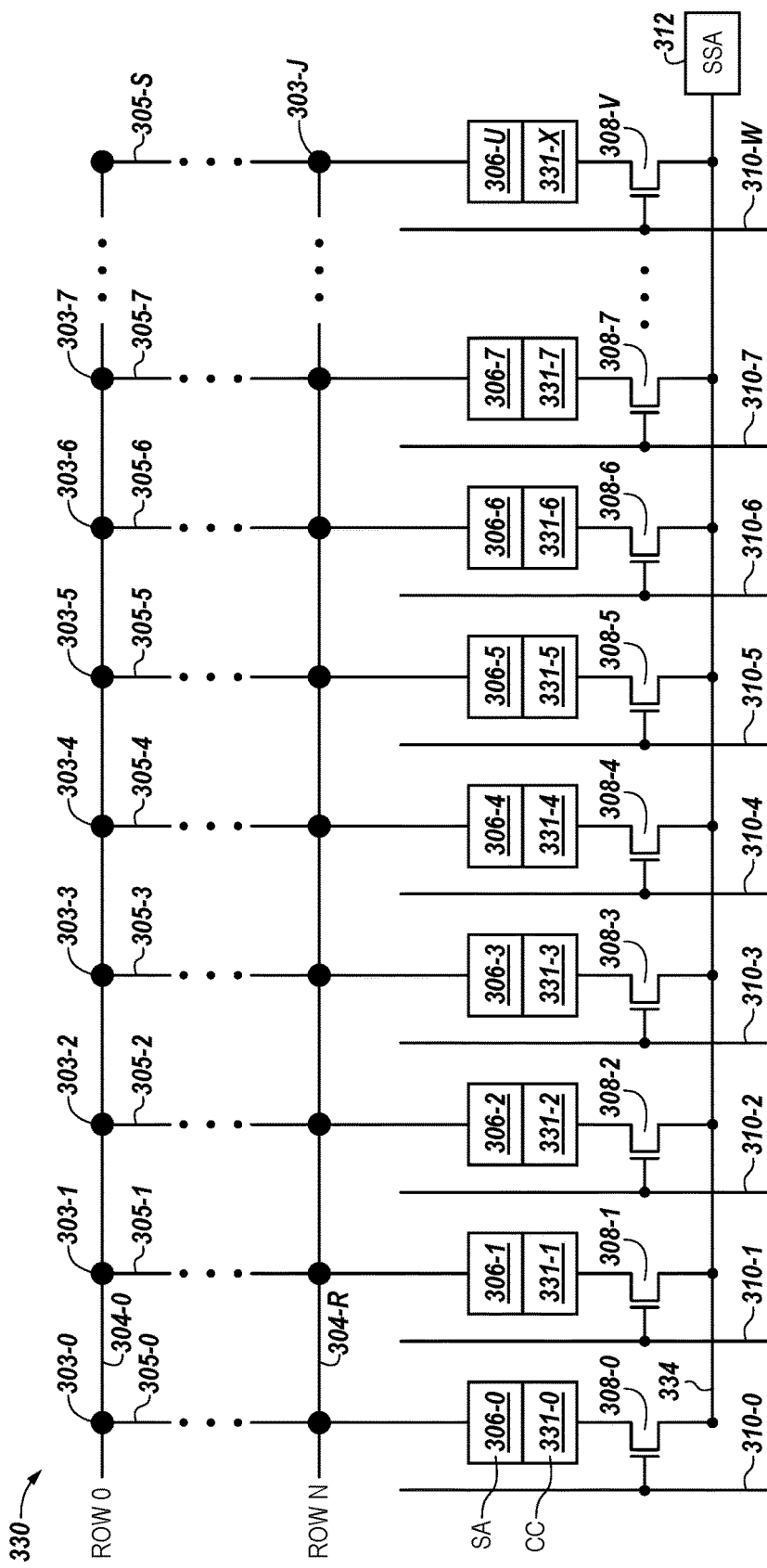

FIG. 3A illustrates a schematic diagram of a portion of a memory array 330 in accordance with a number of embodiments of the present disclosure. The array 330 includes memory cells (referred to generally as memory cells 303, and more specifically as 303-0 to 303-J) coupled to rows of access lines 304-0, 304-1, 304-2, 304-3, 304-4, 304-5, 304-6, . . . , 304-R (referred to generally as access lines 304) and columns of sense lines 305-0, 305-1, 305-2, 305-3, 305-4, 305-5, 305-6, 305-7, . . . , 305-S (referred to generally as sense lines 305). Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U (referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X corresponding to respective sense amplifiers 306 and coupled to the respective sense lines 305. Column decode lines 310-1 to 310-W are coupled to the gates of transistors 308-1 to 308-V, respectively, and can be selectively activated to transfer data sensed by respective sense amplifiers 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

In a number of embodiments, the sensing circuitry (e.g., compute components 331 and sense amplifiers 306) is configured to perform a gather operation on elements stored in array 330. As an example, a plurality of elements each comprising four data units (e.g., 4-bit elements) can be stored in a plurality of memory cells. A first element of the plurality of elements can be stored in a first group of memory cells coupled to a number of access lines (e.g., 304-0, 304-1, 304-2, 304-3) and to a sense line (e.g., 305-0), and a second element can be stored in a second group of memory cells coupled to the number of access lines (e.g., 304-0 to 304-3) and to a different sense line (e.g., sense line 305-4, which corresponds to a different column of array 330). As such, the first element and the second element are stored in a horizontally non-contiguous fashion (e.g., since the cells storing the first element and the second element correspond to non-adjacent columns). For example, in this example, the sense line 305-0 coupled to cells storing the first element is separated from the sense line 305-4 coupled to cells storing the second element by intervening sense lines 305-1, 305-2, and 305-3.

FIG. 3B illustrates a schematic diagram of a portion of a memory array in accordance with a number of embodiments of the present disclosure. FIG. 3B represents an example of data stored in a portion of an array such as array 330 shown in FIG. 3A. The array shown in FIG. 3B includes a number of elements comprising data units (e.g., bits) stored vertically in the array. However, in FIG. 3B the elements are stored in a horizontally non-contiguous fashion. The array shown in FIG. 3B includes four 8-bit elements. A first element ("11111111") is stored in memory cells coupled to sense line 305-0 and to access lines 304-0 to 304-7. A second element ("00000000") is stored in memory cells coupled to sense line 305-8 and access lines 304-0 to 304-7. The first element and the second element are considered to be horizontally non-contiguous because there are intervening columns (e.g., columns corresponding to sense lines 305-1 to 305-7) between the first and second element. The "X"s shown in FIG. 3B designate cells not storing data corresponding to elements of interest. In this example, a third element ("11110000") is stored in memory cells coupled to sense line 305-0 and access lines 304-8 to 304-15, and a fourth element ("11110000") is stored in memory cells coupled to sense line 305-8 and access lines 304-8 to 304-15. The third element and fourth element are also horizontally non-contiguous. While the example shown in FIG. 3B illustrates two elements (that are stored vertically) per row (e.g., elements stored in memory cells coupled to two different sense lines, 305-0 and 305-8), examples are not so limited. For example, a first example element (such as element "11111111") is stored in cells of row 304-0 to 304-7 and column 205-0 and a second example element (such as element "00000000") is stored in cells of rows 304-0 to 304-7 and column 305-8 but the first and second elements are only stored in two cells along row 304-0 (e.g., corresponding to columns 305-0 and 305-8). A third example element (such as element "11110000") is stored in cells of rows 304-8 to 304-15 and column 305-0 and a fourth example element (such as element "11110000") is stored in cells of rows 304-8 to 304-15 and column 305-8. As stated above, examples are not so limited and any number of elements can be stored vertically along a row of memory cells. In addition, a memory array is not limited to the number of columns or number of rows of memory cells and/or elements within those columns and rows of memory cells.

FIG. 3C illustrates a schematic of a portion of a memory array in accordance with a number of embodiments of the present disclosure. FIG. 3C is an example of data units being stored in a memory array in a horizontally contiguous fashion. A first element including "11111111" is stored as a vertical vector in memory cells coupled to access lines 304-0 to 304-7 and sense line 305-0, a second element including "00000000" is stored as a vertical vector in memory cells coupled to access lines 304-0 to 304-7 and sense line 305-1, a third element including "11110000" is stored as a vertical vector in memory cells coupled to access lines 304-8 to 304-15 and sense line 305-8, and a fourth element including "11110000" is stored as a vertical vector in memory cells coupled to access lines 304-8 to 304-15 and sense line 305-9. The first element and second element are stored as horizontally contiguous vectors in FIG. 3C. The third and fourth elements are stored as horizontally contiguous vectors in FIG. 3C. While the example in FIGS. 3B and 3C reference elements including eight (8) data units (e.g., bits), examples are not so limited. For example, element widths can be 4, 8, 16, 32, etc. data units.

An example of a gathering operation is described below in association with FIG. 4, which illustrates tables showing the states of memory cells of an array (e.g., 330 in FIG. 3A) at a number of particular phases associated with performing a gathering operation in accordance with a number of embodiments described herein. The reference numbers of the rows of the tables shown in FIG. 4 correspond to respective reference numbers of the pseudo code described below (e.g., row 451-0 corresponds to reference number 0 of the pseudo code, rows 451-4.1a to 451-4.1k correspond to reference number 4 (e.g., 4a to 4k) of the pseudo code, etc.). Each row of the tables indicates the data values of a number of bit vectors 431 (COMP_COMP), 433 (TMPLOOKUP), 435 (TMPELEM), 437 (ELEM_MASK), and 439 (DEST) at a particular phase of the gathering operation as can be stored in rows and/or columns of memory cells in the array (e.g., 330 in FIG. 3A).

The example shown in FIG. 4 is associated with gathering a first data unit of elements stored in memory cells coupled to access line 304-0 and to sense lines 305-0 to 305-31. More specifically, the example illustrates a first data unit position (e.g., most significant bit of each element stored in a first row of memory cells such as memory cells 303-0 to 303-31 in FIG. 3A, cells 303-8 to 303-31 not shown) of each element stored in an array. The gathering operation example will perform a gather of a first data unit of each element stored vertically in memory cells coupled to sense lines 305-0, 305-4, 305-8, 305-12, 305-16, 305-20, 305-24, and 305-28, respectively (sense lines 305-8 to 305-28 not shown but indicated by 305-S). For example, the horizontal vector [0x88,88,88,88] (binary [1000 1000, 1000 1000, 1000 1000, 1000 1000) illustrated as DEST 439 in row 451-0 designates a first data unit of each of eight elements (where each element is eight data units in length) stored vertically in the array. As an example of how DEST 439 is stored, and not to be correlated directly with FIG. 3C as FIG. 3C shows a different example of element values, the "1" bit stored in memory cell of access line 304-0 and sense line 305-0 in FIG. 3C is a first data unit (e.g., most significant bit) of the vertically stored element "11111111." Likewise, the "0" bit stored in memory cell of access line 304-0 and sense line 305-1 in FIG. 3C is a first data unit of the vertically stored element "00000000." The data stored in memory cells coupled to access line 304-0 stored as a row (illustrated horizontally) includes "10XXXXXXXXXXXXXX" and corresponds to the DEST 439 vector [0x88,88,88,88] illustrated in FIG. 4. For example, the first data unit of each element (shown as a horizontal row of values) illustrated in FIG. 4 can be compared, for illustrative purposes, with the first data unit of each element (e.g., bolded bit of [10XXXXXXXXXXXXXX]) stored in cells coupled to access line 304-0 and sense lines 305-0 to 305-15 (not to be directly correlated as FIG. 3C is a 16 element example, meaning 16 elements across 16 sense lines that are stored vertically, and FIG. 4 is a 32 element example, meaning 32 elements across 32 sense lines that are stored vertically but only illustrated as the first horizontal row of first data units of each element).

In FIG. 4, the first data unit (e.g., most significant bit) of the first element (e.g., the "1" indicated by the first "8" in [0x88,88,88,88], indicated in bold) is in a first row of cells and the subsequent seven data units (e.g., next most significant bit to least significant bit) of the first element stored vertically are not illustrated (although these next seven data units would be stored in memory cells coupled to access lines 304-1 to 304-7, indicated by 304-R in FIG. 3A). The first data unit of the second element (e.g., the second 8 in [0x88,88,88,88], indicated in bold) is in the first row of cells and stored in a memory cell coupled to a fourth column of cells or coupled to sense line 305-4. The first data unit of the third element is stored in a memory cell coupled to sense line 305-8, the first data unit of the fourth element is stored in a memory cell coupled to a sense line 305-12, the first data unit of the fifth element is stored in a memory cell coupled to sense line 305-16, the first data unit of the sixth element is stored in a memory cell coupled to sense line 305-20, the first data unit of the seventh element is stored in a memory cell coupled to sense line 305-24, and the first data unit of the eighth element is stored in a memory cell coupled to sense line 305-28. In the example below, the first data unit of eight elements are represented by bit-vector DEST 439 (e.g., [1000 1000 1000 1000 1000 1000 1000 1000], which can be represented in hexadecimal notation as [0X88888888] (where the "Ox" indicates hexadecimal notation and commas can separate different elements) and is shown in FIG. 4 as "0X88,88,88,88").

In this example, the bit-vector DEST 439 has a width of 32 data units (e.g., bits). Each element of bit-vector DEST 439 is 4 data units (e.g., bits) wide. It is noted that although hexadecimal notation is used in FIG. 4, the bit-vectors are stored as binary data patterns in the array during the gathering operation. Also, in the examples described herein, commas and/or spaces may be used to separate a number of elements within a bit-vector for ease of reference. For instance, in the example above, bit-vector DEST 439 groups elements by twos between each comma. Embodiments are not limited to a particular element size (e.g., to a particular number of bits per element) or to a particular quantity of elements. The result of the gathering operation can be stored in an array (e.g., 330) with the vectors comprising the elements being gathered being stored, and/or being transferred external to the array (e.g., to functional unit circuitry of a host).

The expected result of gathering the first data units of each of the elements of DEST 439 (e.g., [0X88,88,88,88] in hexadecimal) is resulting bit-vector [0XFF,00,00,00] (e.g., DEST 439 stored at 451-4.8 in FIG. 4). As described further below, the result of a gathering operation can be stored as a bit-vector in a particular group of memory cells. For instance, in the example of FIG. 4, the memory cells corresponding to DEST 439 can be used to store the result of the gathering operation at 451-4.8. As such, at the conclusion of the example described in FIG. 4, the value of DEST 439 in hexadecimal (e.g., binary [1111 1111 0000 0000 0000 0000 0000 0000]), which represents the eight resultant elements being stored in the 8 columns furthest to the left of the memory array (e.g., $1^{st}$ through $8^{th}$) rather than the $1^{st}$, $5^{th}$, $9^{th}$, 13th, $17^{th}$, $21^{st}$, $25^{th}$, and $29^{th}$ columns at the start of the example.

As described further below, the bit vectors 433 (TMPLOOKUP), 435 (TMPELEM), 437 (ELEM_MASK), and 439 (DEST) can be used in association with gathering respective elements of the source bit-vector which is stored as DEST 439 at row 451-0 in FIG. 4, where a source bit-vector is a bit-vector provided to be gathered. The bit-vectors 433, 435, 437, and 439 can be stored in respective groups of memory cells coupled to particular access lines, which may be referred to as temporary storage rows. As used herein, temporary storage rows of memory cells are storing data that may be updated during various phases of a gathering operation. As an example, the bit-vectors 433, 435, 437, and 439 can have a same width (e.g., 32 bits) and can each be stored in cells coupled to a plurality of sense lines and an access line (e.g., horizontally stored). For instance, the bit-vector 439 (DEST) can have a width of 32 bits and can be stored in a group of cells coupled to access line 304-0 and to sense lines 305-0 to 305-31. Bit-vector 439 (DEST) can include a first data unit of each of a number of vertically stored elements, as described above (where the second through the eighth data units are not illustrated and would be stored in subsequent second through eight rows of memory cells and gathered per data stored in each row of cells).

In a number of examples, a gathering operation includes performing a number of AND operations, OR operations, SHIFT operations, and INVERT operations. The gathering operation includes performing the AND operations, OR operations, SHIFT operations, and INVERT operations without transferring data via an input/output (I/O) line to gather a number of elements of a bit-vector. The number of AND operations, OR operations, INVERT operations, and SHIFT operations can be performed using sensing circuitry on pitch with the memory array and with each of a number of columns of complementary sense lines.

The below pseudocode represents instructions executable to perform a number of gathering operations in a memory in accordance with a number of embodiments of the present disclosure. The example pseudocode is referenced using reference numbers 0-4, which correspond to the reference numbers of the rows shown in the tables of FIG. 4 and in reference to the column numbers of the tables of FIG. 4. For instance, reference number 0 (e.g., "Get Temp Rows TMPLOOKUP, TMPELEM, ELEM_MASK, and DEST") corresponds to row 451-0 and to columns 433, 435, 437, and 439, and reference number 1 (e.g., "Generate MSB and Shift Right for Vector Width") corresponds to row 451-1 and to column 431. Reference number 4a. (e.g., "Load Tmp_Lookup into COMP_COMP") corresponds to rows 451-4.1a, 451-4.2a, 451-4.3a, 451-4.4a, 451-4.5a, 451-4.6a, 451-4.7a, and 451-4.8a, and to columns 431 and 433 shown in FIG. 4.

0. Get Temp Rows TMPLOOKUP, TMPELEM, ELEM_MASK, and DEST;
1. Generate MSB;
2. Shift Right for Vector Width;
3. Store in ELEM_MASK, TMPLOOKUP and Obtain number of elements with vector width and array size;
4. Run fixed loop for e elements;
   4a. Load Tmp_Lookup to COMP_COMP;
   4b. AND COMP_COMP and DEST;
   4c. SHIFT left e*(element width minus 1);
   4d. Store COMP_COMP in TMPELEM;
   4e. INVERT TMPLOOKUP and store as COMP_COMP;
   4f. AND COMP_COMP and DEST;
   4g. OR COMP_COMP and TMPELEM;
   4h. Store COMP_COMP in DEST;
   4i. Load TMPLOOKUP into COMP_COMP;
   4j. SHIFT Right element width;
   4k. Store COMP_COMP in TMPLOOKUP;

For purposes of discussion, the above pseudo code will be divided into a setup phase and a gathering phase associated with performing a gathering operation (e.g., gathering a first data unit of each of eight elements initially stored as DEST 439, each first data unit at a particular position horizontally). The pseudo code referenced by reference numbers 0-3 can correspond to the setup phase. The setup phase can be performed simultaneously for a number of the gathering operations. In the example illustrated in FIG. 4, a bit-vector value illustrated in bold indicates a change in the value of the bit-vector (e.g., the value of the bit-vector stored in the memory cells corresponding to TMPLOOKUP 433 is shown in bold in FIG. 4 to indicate a change from [0x00,00,00,00] as shown in row 451-2 to [0x08,00,00,00] as shown in row 451-3). FIG. 4 illustrates the values of a number of bit-vectors associated with performing the setup phase of a gathering operation. The pseudo code referenced by reference number 4 (e.g., 4a-4k) can correspond to the gathering phase.

In a number of embodiments, the setup phase can be performed simultaneously for all of the vertically stored elements to be gathered. The results (e.g., the resulting stored bit-vectors) corresponding to a number of operations performed in the setup phase are shown in FIG. 4. Rows 451-0 to 451-3 of the table in FIG. 4 correspond to the above pseudocode instructions referenced by reference numbers 0 to 3, respectively. As such, rows 451-0 to 451-3 indicate values of the bit vectors 431, 433, 435, 437, and 439 during execution of the setup phase as described by the above pseudocode. Reference number 0 (e.g., "Get Temp Rows TMPLOOKUP, TMPELEM, ELEM_MASK, and DEST") of the above pseudocode is associated with initializing a number of groups of memory cells for use as temporary storage rows to be used to store bit-vectors (e.g., 433, 435, 437, and 439). Initializing refers to designating and/or assigning particular access lines used to store particular bit-vectors for performing the gathering operation. For example, the number of groups of memory cells can be initialized and/or designated groups of cells that can be coupled to respective access lines (e.g., rows) that store data (e.g., on a temporary basis) in association with performing the gathering operation. For example, a first group of memory cells can be coupled to a particular access line (e.g., 304-0, ROW 0 in FIG. 3A) and can store a bit-vector referred to as a "TMPLOOKUP" bit-vector 433. A second group of memory cells can be coupled to another access line (e.g., 304-1, ROW 1, not shown) and can store a bit-vector referred to as a "TMPELEM" bit-vector 435. A third group of memory cells can be coupled to another access line (e.g., 304-2, ROW 2, not shown) and can store a bit-vector referred to as an "ELEM_MASK" bit-vector 437. A fourth group of memory cells can be coupled to another access line (e.g., 304-3, ROW 3, not shown) and can store a bit-vector referred to as a "DEST" bit-vector 439. Embodiments are not limited to a particular number of temporary storage rows and/or to storage of the corresponding bit-vectors on particular access lines. Also, although the groups of memory cells used to store bit-vectors 433, 435, 437, and 439 may be referred to as "rows," the respective groups of memory cells may comprise fewer than all of the cells coupled to a particular access line. Furthermore, in a number of embodiments, temporary storage rows can refer to access lines which may not be addressable by a user (e.g., access lines that are outside of a user-addressable address space). In a number of examples, the bit-vectors stored in memory cells corresponding to the temporary storage rows are stored in memory cells coupled to the same sense lines as the elements that are being gathered.

The ELEM_MASK 437 indicates a most significant bit (MSB) associated with the first data unit (e.g., most significant bit) of the second element of the bit-vector of the elements being gathered. As an example, a bit pattern comprising a "1" in a MSB position of the second element and all "0s" in the remaining bit positions can be used to indicate the MSB of the constituent bit-vector of the source elements (e.g., DEST 439). As such, the bit pattern of ELEM_MASK 439 identifies a starting point indicated as the most significant bit of the second element to be gathered. As shown in row 451-0 of FIG. 4, in this example, ELEM_MASK 439 is a 32-bit hexadecimal bit-vector [0x08,00,00,00] (e.g., binary [0000 1000 0000 0000 0000 0000 0000 0000]).

Row 451-0 of the table shown in FIG. 4 illustrates the values of the first data unit (e.g., most significant bit) of each element to be gathered stored as DEST 439 upon being stored (e.g., loaded) in an array (e.g., 330). As noted above, although the values of the bit-vector are shown in FIG. 4 in hexadecimal form for convenience, designated by the leading "0x" (e.g., the value of bit-vector 439 is shown as [0x88,88,88,88]), the bit-vectors can be stored as binary data patterns in the array. As noted above, an example gathering operation associated with execution of the above pseudocode includes gathering eight elements that are separated from each other by three columns (e.g., by three memory cells (further indicated as three columns of pairs of complementary sense lines, as described above) each as indicated by vector [0x88,88,88,88], binary [1000 1000, 1000 1000, 1000 1000, 1000 1000]). The resulting gathered first data units of each of the elements include a bit-vector of [0xFF, 00,00,00] (e.g., binary [1111 1111, 0000 0000, 0000 0000, 0000 0000], as indicated at row 451-4.8 in FIG. 4).

Reference number 1 (e.g., "Generate MSB and Shift Right for Vector Width") of the above pseudocode is associated with generating a most significant bit ("MSB") of the bit-vector which indicates a first data unit of each of the eight elements (e.g., horizontal bit-vector) and shifting right a width of the vector width (e.g., width of an element in the vector, which is illustrated as 32 bits in this example). Since each element in the horizontal bit-vector is 4 bits apart, the MSB will be shifted 4 positions (4 memory cells, which corresponds to 4 columns) to the right. Finding the MSB of the horizontal bit-vector includes the following operations. The compute components (e.g., 331) storing the bit-vector COMP_COMP 431 are cleared by loading zeros such that value of COMP_COMP 431 is [0x00,00,00,00]. The compute components corresponding to COMP_COMP 431 are then set to all data values being "1" such that the value of COMP_COMP 431 is [0xFF,FF,FF,FF]. The value of COMP_COMP 431 is then shifted one position to the right by replacing open positions that are shifted (e.g., most significant bit shifted to next most significant bit position) with a "0" data value. For example, after a right shift by one position, the value of COMP_COMP 431 would be [0x7F, FF,FF,FF] (e.g., binary [0111 1111, 1111 1111, 1111 1111, 1111 1111]). COMP_COMP 431 is then inverted, resulting in the value of COMP_COMP becoming [0x80,00,00,00], as illustrated in COMP_COMP 431 at row 451-1.

Reference number 2 (e.g., "Shift Right for Vector Width"), includes shifting COMP_COMP 431 one vector width (e.g., distance between each element within the vector) to the right. For example, in this example, COMP_COMP 431 (e.g., [0x80,00,00,00]) is shifted 4 positions to the right as each element is 4 data unit positions apart. The shifting results in COMP_COMP 431 having a value of [0x08,00,00,00] as shown at row 451-2 of the table shown in FIG. 4.

Reference number 3 (e.g., "Store in ELEM_MASK, TMPLOOKUP and Obtain number of elements with vector width and array size") includes storing the value of COMP_COMP 431 to ELEM_MASK 437 and to TMPLOOKUP 433 and obtaining the number of elements, a distance between elements, and the total bit-vector width (e.g., in this case distance between each vertically stored element, which is 4 bits). As illustrated at row 451-3 in FIG. 4, bit-vector [0x08,00,00,00] stored in the compute components corresponding to COMP_COMP 431 is stored to TMPLOOKUP 433 and ELEM_MASK 437. The value of DEST 439 (e.g., [0x88,88,88,88]) indicates that there are eight elements to be gathered, each element is 4 data units apart, and the bit-vector comprises a total of 32 data units. For example DEST 439, in binary, is [1000 1000, 1000 1000, 1000 1000, 1000 1000], where each "1" in the DEST 439 bit-vector indicates a first data unit of each vertically stored element and, since there are eight "1"s in DEST 439, eight elements are indicated. At the conclusion of the setup phase corresponding to reference numbers 0-3 of the above pseudocode, and as shown in row 451-3 of FIG. 4, The value of TMPLOOKUP 433 is [0x08,00,00,00] (e.g., binary [0000 1000, 0000 0000, 0000 0000, 0000 0000]), the value of TMPELEM 435 is [0x00,00,00,00] (e.g., binary [0000 0000, 0000 0000, 0000 0000, 0000 0000]), the value of ELEM_MASK 437 is [0x08,00,00,00] (e.g., binary [0000 10000, 0000 0000, 0000 0000, 0000 0000]), and the value of DEST 439 is [0x88,88,88,88] (e.g., binary [1000 1000, 1000 1000, 1000 1000, 1000 1000]).

FIG. 4 illustrates the values of the number of bit-vectors 433, 435, 437, and 439 during a first iteration 451-4.1, a second iteration 451-4.2, a third iteration 451-4.3, a fourth iteration 451-4.4, a fifth iteration 451-4.5, a sixth iteration 451-4.6, a seventh iteration 451-4.7, and an eighth iteration 451-4.8 of gathering phases associated with reference numbers 4a-4k referenced above. Each iteration is associated with gathering a particular data unit of each of the vertically stored elements such that it is contiguous (e.g., adjacent) to a data unit of a preceding vertically stored element. For example, a first iteration gathers a first data unit of a second element to be next to a first data unit of a first element. A second iteration gathers a first data unit of a third element to be next to the first data unit of the second element, and so forth until the first data units of each of the eight elements are contiguously stored in eight neighboring memory cells (e.g., memory cells 303-0 to 303-7).

Reference number 4 (e.g., "Run fixed loop for e elements"), includes performing a loop that gathers each element next to a previous element in the bit-vector a number of iterations equal to the number ("e") of elements. Since there are eight elements in DEST 439 (e.g., [0x88,88,88, 88]), the loop will run eight times to gather each of the eight elements. Each loop of reference number 4 is associated with an element to be gathered. For example, a first loop represented by rows 451-4.1a to 451-4.1k will gather a first data unit of a second element to be next to a first data unit of a first element. For example [0x88] of DEST 439 (e.g., [0x88,88,88,88]) will be gathered to result in [0xC0] as indicated by DEST 439 at row 451-4.1h. A second loop indicated by rows 451-4.2a to 451-4.2k will gather [0x88,8] of [0x88,88,88,88] to result in [0xE0] as indicated by DEST

439 of [0xEo,08,88,88] at row 451-4.2h. A third, fourth, fifth, sixth, and seventh loop will result in gathering DEST 439 of [0x88,88,88,88] at row 451-4.1a to DEST 439 of [0xFF,00,00,00] at row 451-4.7k.

During a first iteration of the loop for a number of elements, reference number 4a (e.g., "Load Tmp_Lookup to COMP_COMP") of the above pseudocode is associated with storing bit-vector TMPLOOKUP 433 (e.g., [0x08,00,00,00]) as COMP_COMP 431, as illustrated at row 451-4.1a in FIG. 4.

Reference number 4b (e.g., "AND COMP_COMP and DEST") of the above pseudocode is associated with performing an AND operation on COMP_COMP 431 and DEST 439. For example, COMP_COMP 431 (e.g., bit-vector [0x08,00,00,00]) is ANDed with DEST 439 (e.g., [0x88,88,88,88]), resulting in bit-vector [0x08,00,00,00], as illustrated at row 451-4.1b. As used herein, performing a logical operation on a first and second bit-vector can include performing, in parallel, the logical operation on each of the respective bits at corresponding bit positions of the bit-vectors. As an example, the result of a logical AND operation performed on a first bit-vector "a" (e.g., [$a_0\ a_1\ a_2\ a_3$]) and a second bit-vector "b" (e.g., [$b_0\ b_1\ b_2\ b_3$]) is a bit-vector "c" (e.g., [$c_0\ c_1\ c_2\ c_3$]) whose MSB (e.g., $c_0$) is the result of "ANDing" the MSB of bit-vector "a" and the MSB of bit-vector "b," whose next MSB is the result of ANDing the next MSBs of bit-vectors "a" and "b," and whose LSB is the result of ANDing the LSB of bit-vector "a" and the LSB of bit-vector "b" (e.g., $c_0=a_0$ AND $b_0$; $c_1=a_1$ AND $b_1$; $c_2=a_2$ AND $b_2$; $c_3=a_3$ AND $b_3$). For instance, performing an AND operation on a bit-vector [1110] and on bit-vector [1000] would result in bit-vector [1000] (e.g., the MSB of the resultant bit-vector is "1" since "1" AND "1" is "1", the next MSB is "0" since "1" AND "0" is "0", the next MSB is "0" since "1" AND "0" is "0", and the LSB is "0" since "0" AND "0" is "0").

Reference number 4c (e.g., "SHIFT left e* (element width minus 1)") of the above pseudocode is associated with shifting left a number of positions of memory cells equal to an element width minus 1 multiplied by an element number (e.g., "e"). For example, the element width is equal to 4 data units (e.g., 4 data units between each element such as a distance of "1" bits from each other in example bit-vector of 10001000). Therefore, element width minus 1 would be equal to 4−1=3. The resulting value of 3 is multiplied by an element number, which refers to which iteration of element is being gathered. In this case, a first element is being gathered so 3 is multiplied by 1 equaling 3 (e.g., total formula is (1*(4−0)=3). Therefore, COMP_COMP 431 (e.g., [0x08,00,00,00]) is shifted 3 positions to the left resulting in bit-vector [0x40,00,00,00] (e.g., binary [0000 1000] is shifted 3 positions to the left resulting in [0100 0000]). Bit-vector [0x40,00,00,00] is stored in COMP_COMP 431 at row 451-4.1c.

Reference number 4d (e.g., "Store COMP_COMP in TMPELEM") of the above pseudocode is associated with storing COMP_COMP 431 (e.g., [0x40,00,00,00]) as TMPELEM bit-vector 435, as illustrated at row 451-4.1d. Reference number 4e (e.g., "INVERT TMPLOOKUP and store as COMP_COMP") of the above pseudocode is associated with inverting TMPLOOKUP bit-vector 433 (e.g., [0x08,00,00,00]) and storing as COMP_COMP 431. For example, TMPLOOKUP 433 (e.g., [0x08,00,00,00]) is inverted to result in bit-vector [0xF7,FF,FF,FF] and as COMP_COMP 431, as illustrated at row 451-4.1e.

Reference number 4f (e.g., AND COMP_COMP and DEST"), of the above pseudocode is associated with performing an AND operation on COMP_COMP 431 and DEST 439. For example, COMP_COMP 431 (e.g., [0xF7,FF,FF,FF]) is ANDed with DEST 439 (e.g., [0x88,88,88,88]), resulting in bit-vector [0x80,88,88,88], as illustrated in COMP_COMP 431 at row 451-4.1f.

Reference number 4g (e.g., "OR COMP_COMP and TMPELEM") of the above pseudocode is associated with performing an OR operation on COMP_COMP 431 (e.g., [0x80,88,88,88]) and TMPELEM 435 (e.g., 40,00,00,00). As used herein, performing a logical operation on a first and second bit-vector can include performing, in parallel, the logical operation on each of the respective bits at corresponding bit positions of the bit-vectors. As an example, the result of a logical OR operation performed on a first bit-vector "a" (e.g., [$a_0\ a_1\ a_2\ a_3$]) and a second bit-vector "b" (e.g., [$b_0\ b_1\ b_2\ b_3$]) is a bit-vector "c" (e.g., [$c_0\ c_1\ c_2\ c_3$]) whose MSB (e.g., $c_0$) is the result of "ORing" the MSB of bit-vector "a" and the MSB of bit-vector "b," whose next MSB is the result of ORing the next MSBs of bit-vectors "a" and "b," and whose LSB is the result of ORing the LSB of bit-vector "a" and the LSB of bit-vector "b" (e.g., $c_0=a_0$ OR $b_0$; $c_1=a_1$ OR $b_1$; $c_2=a_2$ OR $b_2$; $c_3=a_3$ OR $b_3$). For instance, performing an OR operation on a bit-vector [1110] and on bit-vector [1000] would result in bit-vector [1110] (e.g., the MSB of the resultant bit-vector is "1" since "1" OR "1" is "1", the next MSB is "1" since "1" OR "0" is "1", the next MSB is "1" since "1" OR "0" is "1", and the LSB is "0" since "0" OR "0" is "0"). Therefore, ORing COMP_COMP 431 (e.g., [0x80,88,88,88]) and TMPELEM 435 (e.g., [0x40,00,00,00]) results in bit-vector [0xC0,88,88,88], as stored in COMP_COMP 431 at row 451-4.1g.

Reference number 4h (e.g., "Store COMP_COMP in DEST"), of the above pseudocode is associated with storing the resultant COMP_COMP 431 (e.g., [0xCo,88,88,88]) as DEST 439, as shown at row 451-4.1h. Reference 4.i (e.g., "Load TMPLOOKUP into COMP_COMP") of the above pseudocode is associated with loading TMPLOOKUP bit-vector 433 (e.g., [0x08,00,00,00]) as COMP_COMP 431 (e.g., loading into compute components 331), as shown at row 451-4.1i. Reference 4.j (e.g., "SHIFT Right element width") of the above pseudocode is associated with shifting COMP_COMP 431 (e.g., [0x08,00,00,00]) by an element width to the right (e.g., by a distance between elements, which in this example is 4 bits). The resulting bit-vector [0x00,80,00,00] is illustrated as COMP_COMP 431 at row 451-4.j. Reference 4.k (e.g., "Store COMP_COMP in TMPLOOKUP") of the above pseudocode is associated with storing the resulting bit-vector (e.g., [0x00,80,00,00]) as TMPLOOKUP 433, as shown at row 451-4.1k. The bit-vector stored as TMPLOOKUP 433 (e.g., [0x00,80,00,00]) at the end of the first iteration (e.g., illustrated by rows 451-4.1a through 451-4.1k) indicates during the next iteration which position in the bit-vector to gather the data (e.g., move an element next to a closest element such as a third element next to a second element during a second iteration, where the second element has already been gathered to be next to a first element during this first described iteration).

During a second iteration of the loop for fixed e elements, reference number 4.a (e.g., "Load Tmp_Lookup to COMP_COMP") of the above pseudocode is associated with storing TMPLOOKUP 433 (e.g., [0x00,80,00,00]) as COMP_COMP 431 (e.g., compute components 331-0 to 331-31 in FIG. 3A), as illustrated at row 451-4.2a in FIG. 4.

Reference number 4b (e.g., "AND COMP_COMP and DEST") of the above pseudocode is associated with performing an AND operation on COMP_COMP 431 and DEST 439. For example, COMP_COMP 431 (e.g., bit-vector [0x00,80,00,00]) is ANDed with the DEST bit-vector 439 (e.g., [0xC0,88,88,88]), resulting in bit-vector [0x00, 80,00,00], as illustrated at row 451-4.2b.

Reference number 4c (e.g., "SHIFT left e* (element width minus 1)") of the above pseudocode is associated with shifting left a number of positions of memory cells equal to an element width minus 1 multiplied by an element number. For example, the element width is equal to 4 data units (e.g., 4 data units between each element such as a distance of "1" bits from each other in example bit-vector of 10001000). Therefore, element width minus 1 would be equal to 4−1=3. The resulting value of 3 is multiplied by an element number, which refers to which iteration of element is being gathered. In this case, a second element (e.g., second iteration) is being gathered so 3 is multiplied by 2 equaling 6 (e.g., total formula is (2*(4-0)=6). Therefore, COMP_COMP 431 (e.g., bit-vector [0x00,80,00,00]) is shifted 6 positions to the left resulting in bit-vector [0x20,00,00,00] (e.g., binary [0000 0000 1000 0000] is shifted 6 positions to the left resulting in [0010 0000 0000 0000]). Bit-vector [0x20,00,00,00] is stored as COMP_COMP 431 at row 451-4.2c.

Reference number 4d (e.g., "Store COMP_COMP in TMPELEM") of the above pseudocode is associated with storing COMP_COMP 431 (e.g., [0x20,00,00,00]) as TMPELEM 435, as illustrated at row 451-4.2d. Reference number 4e (e.g., "INVERT TMPLOOKUP and store as COMP_COMP") of the above pseudocode is associated with inverting TMPLOOKUP 433 (e.g., [0x00,80,00,00]) and storing as COMP_COMP 431. For example, TMPLOOKUP 433 (e.g., [0x00,80,00,00]) is inverted to result in bit-vector [0xFF,7F,FF,FF] and stored as COMP_COMP 431, as illustrated at row 451-4.2e.

Reference number 4f (e.g., AND COMP_COMP and DEST"), of the above pseudocode is associated with performing an AND operation on COMP_COMP 431 and DEST 439. For example, COMP_COMP 431 (e.g., [0xFF, 7F,FF,FF]) is ANDed with DEST 439 (e.g., [0xC0,88,88, 88]), resulting in bit-vector [0xC0,08,88,88,88], as illustrated as COMP_COMP 431 at row 451-4.2f.

Reference number 4g (e.g., "OR COMP_COMP and TMPELEM") of the above pseudocode is associated with performing an OR operation on COMP_COMP 431 (e.g., [0xC0,08,88,88]) and TMPELEM 435 (e.g., 20,00,00,00). Performing an OR operation on COMP_COMP 431 (e.g., [0xC0,08,88,88]) and TMPELEM 435 (e.g., [0x20,00,00, 00]) results in bit-vector [0xE0,08,88,88], as stored as COMP_COMP 431 at row 451-4.2g.

Reference number 4h (e.g., "Store COMP_COMP in DEST"), of the above pseudocode is associated with storing the resultant value of COMP_COMP 431 (e.g., [0xE0,08, 88,88]) as DEST 439, as shown at row 451-4.2h. Reference 4.i (e.g., "Load TMPLOOKUP into COMP_COMP") of the above pseudocode is associated with loading TMPLOOKUP bit-vector 433 (e.g., [0x00,80,00,00]) as COMP_COMP 431, as shown at row 451-4.2i. Reference 4.j (e.g., "SHIFT Right element width") of the above pseudocode is associated with shifting COMP_COMP 431 (e.g., [0x00,80,00,00]) by an element width to the right (e.g., by a distance between elements, which in this example is 4 bits). The resulting bit-vector [0x00,08,00,00] is illustrated as stored as COMP_COMP 431 at row 451-4.2j. Reference 4.k (e.g., "Store COMP_COMP in TMPLOOKUP") of the above pseudocode is associated with storing the resulting bit-vector (e.g., [0x00,08,00,00]) as TMPLOOKUP 433, as shown at row 451-4.2k. TMPLOOKUP 433 (e.g., [0x00,08,00,00]) at the end of the second iteration (e.g., illustrated by rows 451-4.2a through 451-4.2k) indicates during the next iteration which position in the bit-vector to gather the data (e.g., move an element next to a closest element such as a fourth element next to a third element during a third iteration, where the third element has already been gathered to be next to a second element during the second iteration described above).

For ease of illustration, iterations 3 through 6 have been concisely illustrated in FIG. 4. While particular bit-vector values are not illustrated for these iterations, the bit-vector calculations based on the pseudocode are still being performed. For the sake of explanation, a brief description of iterations 3 through 6 are included even though not illustrated in FIG. 4. At the end of iteration 3, bit-vector [0x00,00,80,00] is stored as COMP_COMP 431. TMPLOOKUP bit-vector 433 is [0x00,00,80,00], TMPELEM bit-vector 435 is [0x10,00,00,00], ELEM_MASK bit-vector 437 is [0x08,00,00,00], and DEST bit-vector 439 is [0xF0,00,88,88], as illustrated at row 451-4.3. At the end of iteration 4, bit-vector [0x00,00,08,00] is stored as COMP_COMP 431, TMPLOOKUP bit-vector 433 is [0x00,00,08,00], TMPELEM bit-vector 435 is [0x08,00,00, 00], ELEM_MASK bit-vector 437 is [0x08,00,00,00], and DEST bit-vector 439 is [0xF8,00,08,88], as illustrated at row 451-4.4. At the end of iteration 5, bit-vector [0x00,00,00,80] is stored as COMP_COMP 431, TMPLOOKUP bit-vector 433 is [0x00,00,00,80], TMPELEM bit-vector 435 is [0x04, 00,00,00], ELEM_MASK bit-vector 437 is [0x08,00,00,00], and DEST bit-vector 439 is [0xFC,00,00,88], as illustrated at row 451-4.5. At the end of iteration 6, bit-vector [0x00, 00,00,08] is stored as COMP_COMP 431, TMPLOOKUP bit-vector 433 is [0x00,00,00,08], TMPELEM bit-vector 435 is [0x02,00,00,00], ELEM_MASK bit-vector 437 is [0x08,00,00,00], and DEST bit-vector 439 is [0xFE,00,00, 08], as illustrated at row 451-4.6.

During a seventh iteration of the loop, reference number 4.a (e.g., "Load Tmp_Lookup to COMP_COMP") of the above pseudocode is associated with storing TMPLOOKUP 433 (e.g., [0x00,00,00,08]) as COMP_COMP 431 (e.g., compute components 331-0 to 331-31 in FIG. 3A), as illustrated at row 451-4.7a in FIG. 4.

Reference number 4b (e.g., "AND COMP_COMP and DEST") of the above pseudocode is associated with performing an AND operation on the bit-vector stored as COMP_COMP 431 and DEST 439. For example, bit-vector [0x00,00,00,08] stored as COMP_COMP 431 is ANDed with DEST 439 (e.g., [0xFE,00,00,08]), resulting in bit-vector [0x00,00,00,08], as illustrated at row 451-4.7b.

Reference number 4c (e.g., "SHIFT left e* (element width minus 1)") of the above pseudocode is associated with shifting left a number of positions of memory cells equal to an element width minus 1 multiplied by an element number. For example, the element width is equal to 4 data units (e.g., 4 data units between each element such as a distance of "1" bits from each other in example bit-vector of 10001000). Therefore, element width minus 1 would be equal to 4−1=3. The resulting value of 3 is multiplied by an element number, which refers to which iteration of element is being gathered. In this case, a seventh element (e.g., seventh iteration) is being gathered so 3 is multiplied by 7 equaling 21 (e.g., total formula is (7*(4-0)=21). Therefore, bit-vector [0x00,00,00, 08] stored in COMP_COMP 431 is shifted 21 positions to the left resulting in bit-vector [0x01,00,00,00] (e.g., binary [0000 0000, 0000 0000, 0000 0000, 0000 1000] is shifted 21 positions to the left resulting in [0000 0001, 0000 0000, 0000 0000, 0000 0000]). Bit-vector [0x01,00,00,00] is stored as COMP_COMP 431 at row 451-4.7c.

Reference number 4d (e.g., "Store COMP_COMP in TMPELEM") of the above pseudocode is associated with storing COMP_COMP 431 (e.g., [0x01,00,00,00]) as TMPELEM 435, as illustrated at row 451-4.7d. Reference number 4e (e.g., "INVERT TMPLOOKUP and store as COMP_COMP") of the above pseudocode is associated with inverting TMPLOOKUP bit-vector 433 (e.g., [0x00, 00,00,08]) and storing as COMP_COMP 431. For example, TMPLOOKUP 433 (e.g., [0x00,00,00,08]) is inverted to result in bit-vector [0xFF,FF,FF,F7] and stored as COMP_COMP 431, as illustrated at row 451-4.7e.

Reference number 4f (e.g., AND COMP_COMP and DEST"), of the above pseudocode is associated with performing an AND operation on the bit-vector stored as COMP_COMP 431 and DEST 439. For example, COMP_COMP 431 (e.g., [0xFF,FF,FF,F7]) is ANDed with DEST 439 (e.g., [0xFE,00,00,08]), resulting in bit-vector [0xFE, 00,00,00], as illustrated as COMP_COMP 431 at row 451-4.7f.

Reference number 4g (e.g., "OR COMP_COMP and TMPELEM") of the above pseudocode is associated with performing an OR operation on COMP_COMP 431 (e.g., [0xFE,00,00,00]) and TMPELEM 435 (e.g., 01,00,00,00). Performing an OR operation on COMP_COMP 431 (e.g., [0xFE,00,00,00]) and TMPELEM 435 (e.g., [0x01,00,00, 00]) results in bit-vector [0xFF,00,00,00], as stored as COMP_COMP 431 at row 451-4.7g.

Reference number 4h (e.g., "Store COMP_COMP in DEST"), of the above pseudocode is associated with storing the resultant value stored as COMP_COMP 431 (e.g., [0xFF, 00,00,00]) as DEST 439, as shown at row 451-4.7h. Reference 4.i (e.g., "Load TMPLOOKUP into COMP_COMP") of the above pseudocode is associated with loading TMPLOOKUP 433 (e.g., [0x00,00,00,08]) as COMP_COMP 431, as shown at row 451-4.7i. Reference 4.j (e.g., "SHIFT Right element width") of the above pseudocode is associated with shifting COMP_COMP 431 (e.g., [0x00,00, 00,08]) by an element width to the right (e.g., by a distance between elements, which in this example is 4 bits). The resulting bit-vector [0x00,00,00,00] is illustrated as stored as COMP_COMP 431 at row 451-4.7j. Reference 4.k (e.g., "Store COMP_COMP in TMPLOOKUP") of the above pseudocode is associated with storing the resulting bit-vector (e.g., [0x00,00,00,00]) as TMPLOOKUP 433, as shown at row 451-4.7k. The bit-vector stored as TMPLOOKUP 433 (e.g., [0x00,00,00,00]) at the end of the seventh iteration (e.g., illustrated by rows 451-4.7a through 451-4.7k) indicates that the eight elements have been gathered and the eighth iteration will not change the DEST bit-vector 439 (e.g., [0xFF,00,00,00]). For example, at the end of iteration 8, bit-vector [0x00,00,00,00] is stored as COMP_COMP 431, TMPLOOKUP bit-vector 433 is [0x00, 00,00,00], TMPELEM bit-vector 435 is [0x00,00,00,00], ELEM_MASK bit-vector 437 is [0x08,00,00,00], and DEST bit-vector 439 is [0xFF,00,00,00], as illustrated at row 451-4.8.

While the above described example references a single element stored in each column of cells, examples are not so limited. For example, a first element and a second element can be stored in a first column of cells and be referred to as a first vertical vector. A third element and a fourth element can be stored in a second column and be referred to as a second vertical vector. The first vertical vector and the second vertical vector can be gathered such that the first element is adjacent to the third element and the second element is adjacent to the fourth element.

The above described setup and gathering phases gather vectors stored vertically in the memory array that are horizontally non-contiguous and result in the vertical vectors (e.g., a number of elements stored vertically) being stored horizontally contiguous. A number of operations can result in vertical vectors being stored with empty memory cells between each vertical vector and increase a number of operations used to perform further operations. For example, operations performed on data that are horizontally non-contiguous may include additional operations to place the data in memory cells next to each other. By gathering the vertical vectors, increase parallel processing power can be achieved since more of the columns storing the vertical vectors can stored elements to be processed simultaneously without readjusting the data while performing the operations. For instance, if we have 16,384 columns, then we can gather vertical vectors so as to maximize the number of those vectors participating in the processing of the vertical vectors that use contiguous operations, such as shifting data where shifting is performed with respect to spacing and distances from one data unit to another in the array.

The functionality of the sensing circuitry 250-2 of FIG. 2A is described below and summarized in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 and/or 205-2).

Figure 5A:
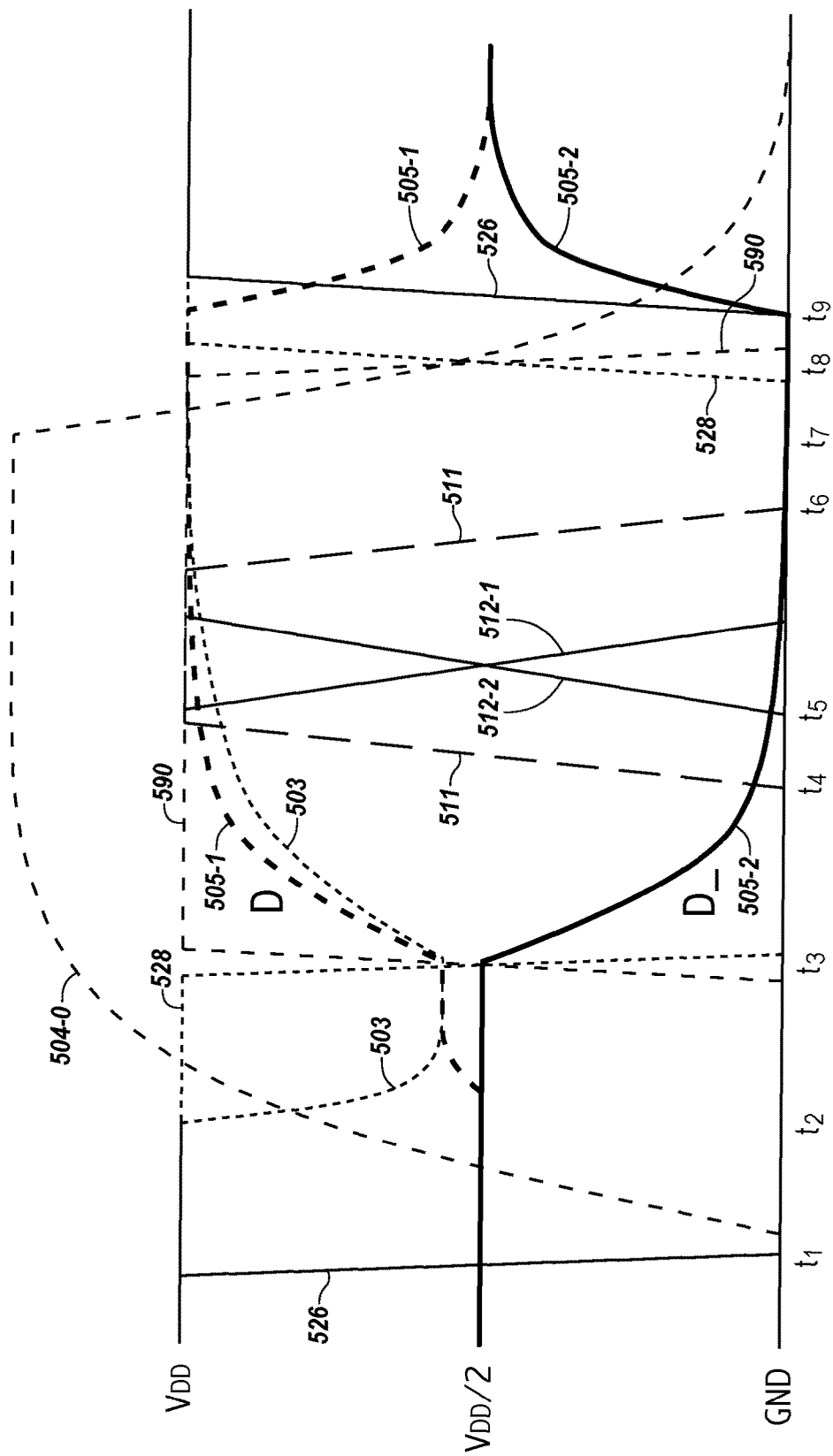
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250-2 of FIG. 2A is described below with respect to performing logical operations and initially storing a result in the compute component 231-2 (e.g., secondary latch of the accumulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground for accessing I/O lines).

In the example illustrated in FIG. 5a, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 shown in FIG. 2A if the cell is a 1 T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy. However, the energy associated with enabling/disabling the row signal 504-0 is distributed over the plurality of memory cells coupled to the row.

At time $t_3$, the sense amplifier (e.g., 206-2 shown in FIG. 2A) is enabled. As shown, a positive control signal 590, e.g., corresponding to ACT 265 shown in FIG. 2B, goes high and the negative control signal 528, e.g., corresponding to RnIF 228 shown in FIG. 2B, goes low. This amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206-2 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the accumulator negative control signal 512-1 (e.g., Accumb) and the accumulator positive control signal 512-2 (e.g., Accum) are activated via respective control lines 212-1 and 212-2 shown in FIG. 2A. As described below, the accumulator control signals ACCUMB 512-1 and ACCUM 512-2 may remain activated for subsequent operation phases. As such, in this example, activating the control signals ACCUMB 512-1 and ACCUM 512-2 enables the secondary latch (e.g., accumulator) of compute component 231-2 shown in FIG. 2A. The sensed data value stored in sense amplifier 206-2 is transferred (e.g., copied) to the secondary latch, including the dynamic latch and static latch 264, as shown in FIG. 2A.

At time $t_6$, the Passd control signal 511 (and the Passdb control signal) goes low thereby turning off the pass transistors (if present). However, since the accumulator control signals ACCUMB 512-1 and ACCUM 512-2 remain activated, an accumulated result is stored (e.g., latched) in the secondary latches (e.g., accumulator). At time $t_7$, the row signal 504-0 is deactivated, and the array sense amps are disabled at time $t_8$ (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
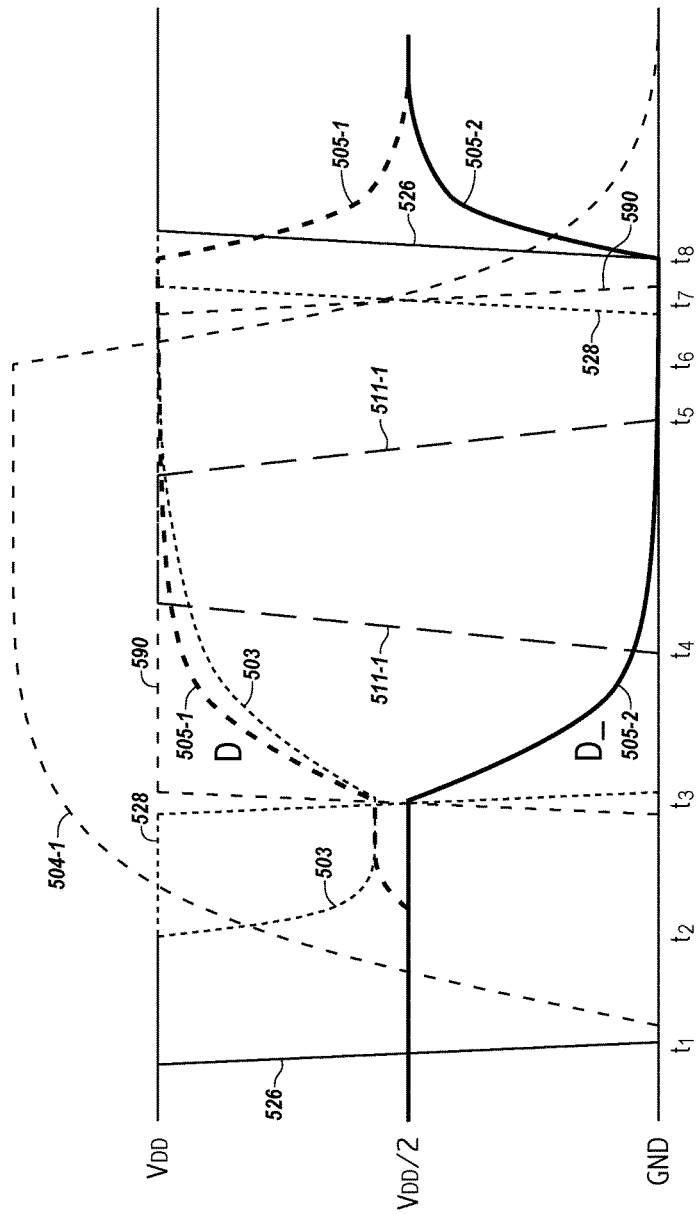
Figure 5C:
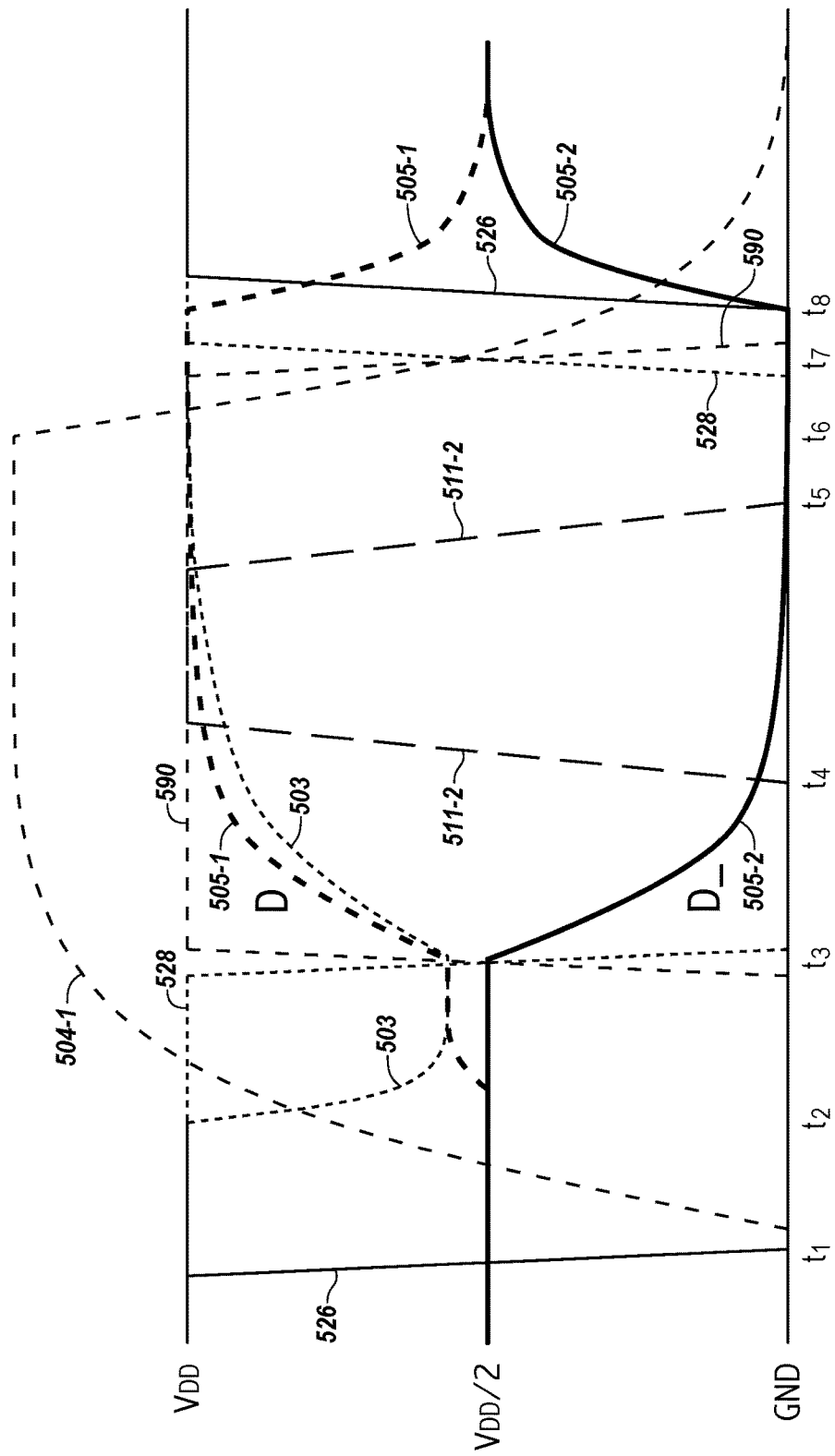

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to FIG. 5C one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy. However, the energy associated with activating/deactivating the row signal 504-1 can be amortized over the plurality of memory cells coupled to the row.

At time $t_3$, the sense amplifier (e.g., 206-2 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low). This amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 512-1 (Accumb) and 512-2 (Accum) were activated during the initial operation phase described with respect to FIG. 5A, and they remain activated during the intermediate operation phase(s).

Since the accumulator was previously enabled, activating only Passd (511-1 as shown in FIG. 5B) results in accumulating the data value corresponding to the voltage signal 505-1 shown in FIG. 5B corresponding to data line D. Similarly, activating only Passdb (511-2 as shown in FIG. 5C) results in accumulating the data value corresponding to the voltage signal 505-2 corresponding to data line D_. For instance, in an example AND/NAND operation shown in the timing diagram illustrated in FIG. 5B in which only Passd (511-1) is activated, if the data value stored in a second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 5C in which only Passdb 511-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 505-2 on D_ is setting the true, e.g., "1", data value of the accumulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time t5), the selected row is disabled (e.g., at time t6), the sense amplifier is disabled (e.g., at time t7), and equilibration occurs (e.g., at time $t_8$). An intermediate operation phase such as that illustrated in FIG. 5B or 5C can be repeated in order to accumulate results from a number of additional rows. As an example, the sequence of timing diagram illustrated in FIGS. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
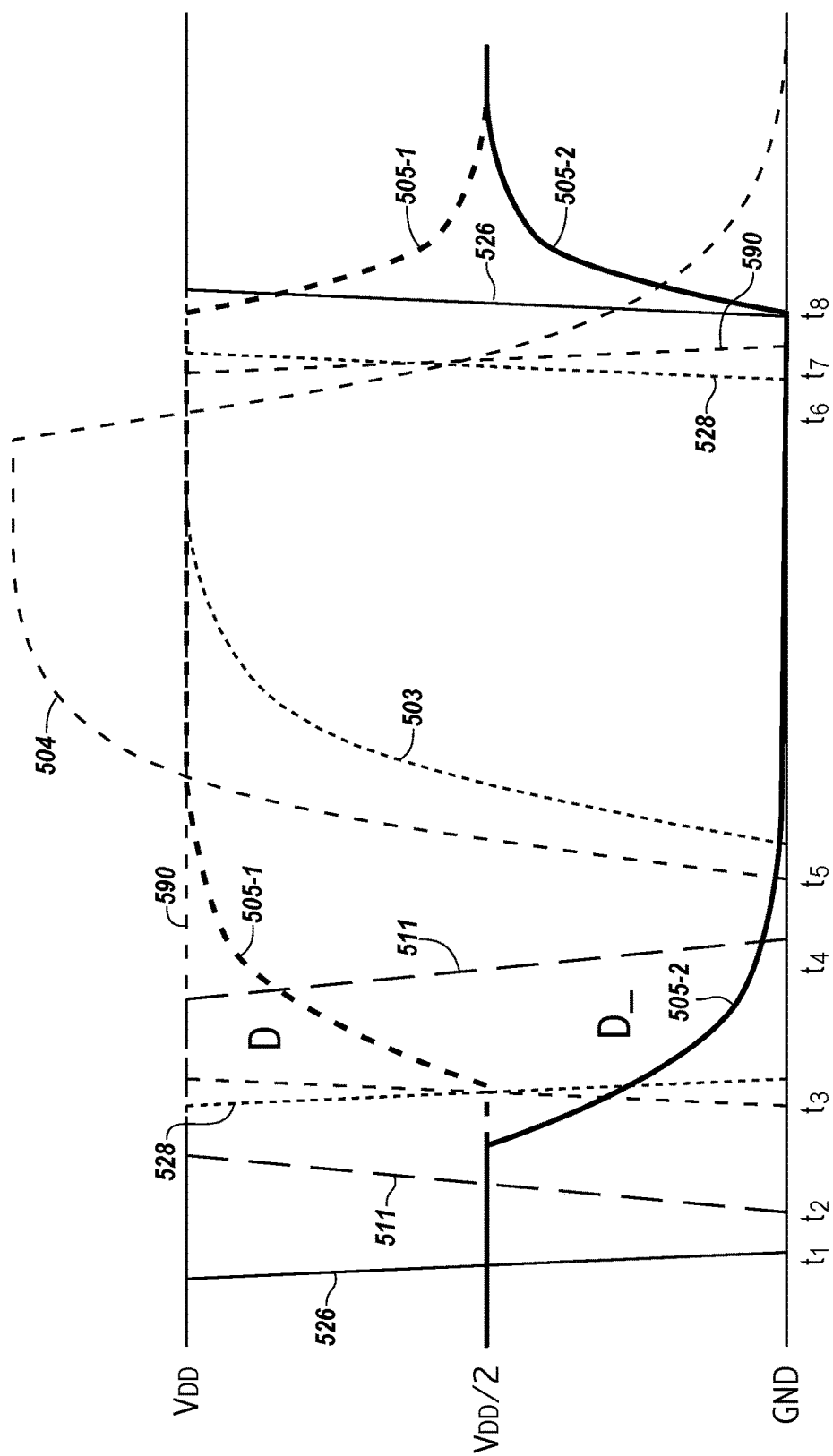

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 2 shown below indicates the Figures corresponding to the sequence of operation phases associated with performing a number of R-input logical operations in accordance with a number of embodiments described herein.

TABLE 2

| Operation | Fig. 5A | Fig. 5B | Fig. 5C | Fig. 5D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time t2, the Passd control signal 511 (and Passdb signal) is activated for an AND or OR operation.

Activating the Passd control signal 511 (and Passdb signal) (e.g., in association with an AND or OR operation) transfers the accumulated output stored in the secondary latch of compute component 231-2 shown in FIG. 2A to the primary latch of sense amplifier 206-2. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206-2 is then enabled (e.g., a positive control signal 590 (e.g., corresponding to ACT 265 shown in FIG. 2B) goes high and the negative control signal 528 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206-2 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time t3, the positive control signal 590 and the negative control signal 528 being deactivated (e.g., signal 590 goes high and signal 528 goes low) to disable the sense amplifier 206-2 shown in FIG. 2A. At time t4 the Passd control signal 511 (and Passdb signal) that was activated at time t2 is deactivated. Embodiments are not limited to this example. For instance, in a number of embodiments, the sense amplifier 206-2 shown in FIG. 2A may be enabled subsequent to time t4 (e.g., after the Passd control signal 511 (and Passdb signal) are deactivated).

As shown in FIG. 5D, at time t5, a selected row is enabled (e.g., by row activation signal 504 going high, which drives the capacitor of the selected cell to the voltage corresponding to the logic value stored in the accumulator. At time t6 the selected row is disabled. At time t7 the sense amplifier 206-2 shown in FIG. 2A is disabled (e.g., positive control signal 528 and negative control signal 590 are deactivated in FIG. 5D), and at time t8 equilibration occurs (e.g., signal 526 is activated and the voltages on the complementary data lines 505-1 (D) and 505-2 (D_) are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250-2 of FIG. 2A as described previously and summarized once again in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 (D) and/or 205-2 (D_)).

Figure 6A:
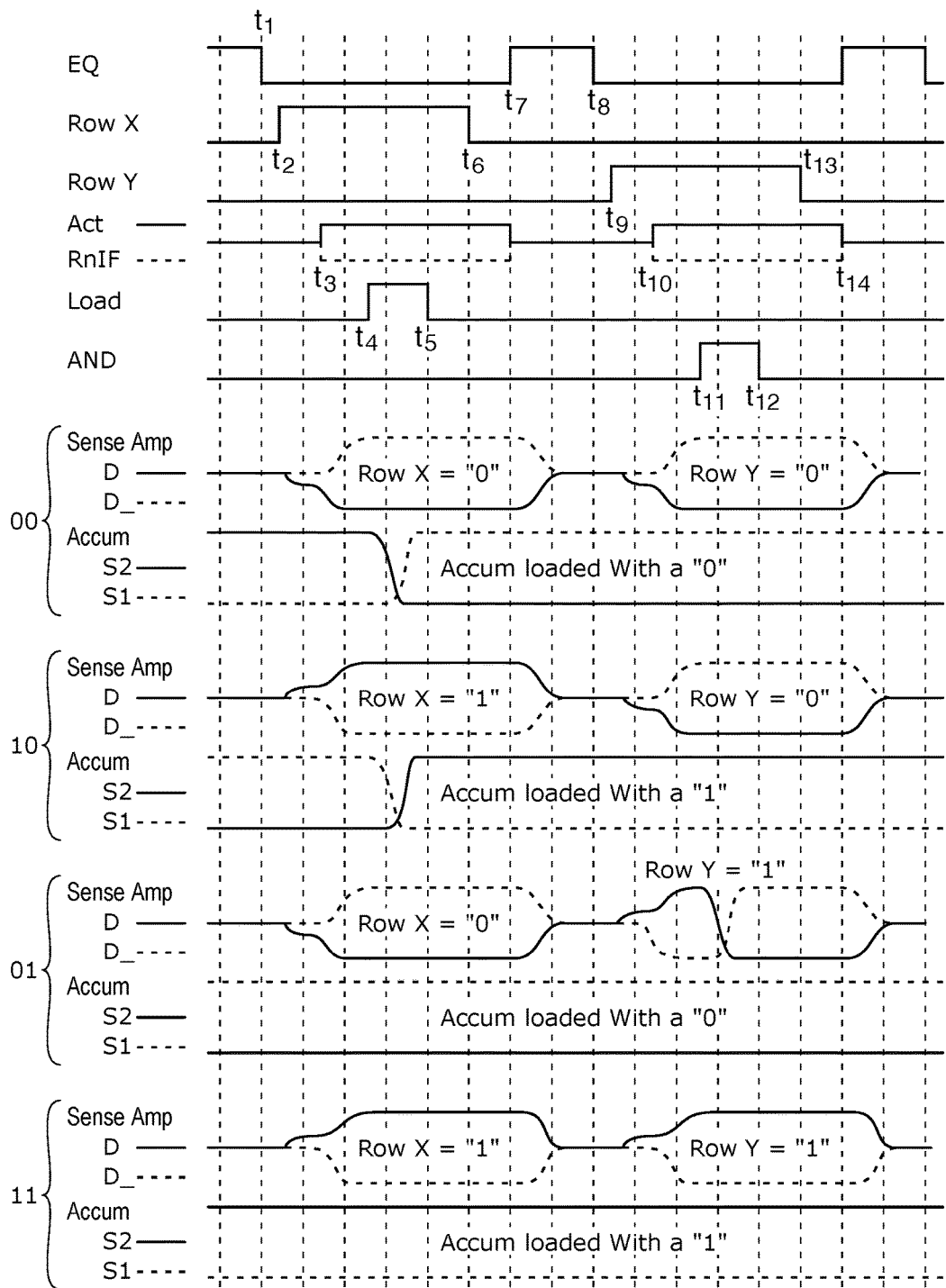
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250-2 in FIG. 2A) to perform the AND logical operation. "EQ" corresponds to an equilibrate signal applied to the sense amp 206-2, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206-2, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D_ corresponding to sense amp 206-2 and on the nodes S1 and S2 corresponding to the compute component 231-2 (e.g., accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
Copy Row X into the Accumulator:
  Deactivate EQ;
  Open Row X;
  Fire Sense Amps (after which Row X data resides in the sense amps);
  Activate LOAD (sense amplifier data (Row X) is transferred to nodes S1 and S2 of the Accumulator and resides there dynamically);
  Deactivate LOAD;
  Close Row X;
  Precharge;

In the pseudo code above, "Deactivate EQ" indicates that an equilibration signal (EQ signal shown in FIG. 6A) corresponding to the sense amplifier 206-2 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 6A. When the voltage signal applied to ROW X reaches the threshold voltage (Vt) of the access transistor (e.g., 202-4) corresponding to the selected cell, the access transistor turns on and couples the data line (e.g., 205-2 (D_)) to the selected cell (e.g., to capacitor 203-4) which creates a differential voltage signal between the data lines.

After Row X is enabled, in the pseudo code above, "Fire Sense Amps" indicates that the sense amplifier 206-2 is enabled to set the primary latch, as has been described herein, and subsequently disabled. For example, as shown at $t_3$ in FIG. 6A, the ACT positive control signal (e.g., 265 shown in FIG. 2B) goes high and the RnIF negative control signal (e.g., 228 shown in FIG. 2B) goes low, which amplifies the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic is placed on the complementary data line 205-2 (D_). The sensed data value is stored in the primary latch of sense amplifier 206-2. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-4, corresponding to Row X, is coupled to the complementary data line D_, while the memory cell including storage element 203-3, corresponding to Row Y, is coupled to data line D. However, as can be seen in FIG. 2A, the charge stored in memory cell 201-4 (corresponding to Row X) corresponding to a "0" data value causes the voltage on data line D_ (to which memory cell 201-4 is coupled) to go high and the charge stored in memory cell 201-4 corresponding to a "1" data value causes the voltage on data line D_ to go low, which is opposite correspondence between data states and charge stored in memory cell 201-4, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the accumulator of the compute component 231-2. The sensed data value stored in the sense amplifier 206-2 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 6A to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206-2 and the secondary latch of the compute component 231-2 shown in FIG. 2A) and the second data value (stored in a memory cell 201-3 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 201-4 coupled to Row X 204-X) and the second data value (e.g., the data value stored in the memory cell 201-3 coupled to Row Y 204-Y) are summarized below. Example pseudo code associated with "ANDing" the data values can include:

Deactivate EQ;
Open Row Y;
Fire Sense Amps (after which Row Y data resides in the sense amps);
Close Row Y;
The result of the logic operation, in the next operation, will be placed on the sense amp, which will overwrite any row that is active;
Even when Row Y is closed, the sense amplifier still contains the Row Y data value;
Activate AND;
This results in the sense amplifier being written to the value of the function (e.g., Row X AND Row Y);
If the accumulator contains a "0" (i.e., a voltage corresponding to a "0" on node S2 and a voltage corresponding to a "1" on node S1), the sense amplifier data is written to a "0";
If the accumulator contains a "1" (i.e., a voltage corresponding to a "1" on node S2 and a voltage corresponding to a "0" on node S1), the sense amplifier data remains unchanged (Row Y data);
This operation leaves the data in the accumulator unchanged.
Deactivate AND;
Precharge;

In the pseudo code above, "Deactivate EQ" indicates that an equilibration signal corresponding to the sense amplifier 206-2 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-3) corresponding to the selected cell, the access transistor turns on and couples the data line (e.g., D_205-2) to the selected cell (e.g., to capacitor 203-3) which creates a differential voltage signal between the data lines.

After Row Y is enabled, in the pseudo code above, "Fire Sense Amps" indicates that the sense amplifier 206-2 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic state is on complementary data line 205-2 (D_). As shown at $t_{10}$ in FIG. 6A, the ACT positive control signal (e.g., 265 shown in FIG. 2B) goes high and the RnIF negative control signal (e.g., 228 shown in FIG. 2B) goes low to fire the sense amps. The sensed data value from memory cell 201-3 is stored in the primary latch of sense amplifier 206-2, as previously described. The secondary latch still corresponds to the data value from memory cell 201-4 since the dynamic latch is unchanged.

After the second data value sensed from the memory cell 201-3 coupled to Row Y is stored in the primary latch of sense amplifier 206-2, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 201-3 from the data line 205-1 (D).

After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231-2 and the second data value (e.g., Row Y) stored in the sense amplifier 206-2, if the dynamic latch of the compute component 231-2 contains a "0" (i.e., a voltage corresponding to a "0" on node S2 and a voltage corresponding to a "1" on node S1), the sense amplifier data is written to a "0" (regardless of the data value previously stored in the sense amp). This is because the voltage corresponding to a "1" on node S1 causes transistor 209-1 to conduct thereby coupling the sense amplifier 206-2 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value. Thus the configuration of the sensing circuitry causes the "0" result to be written and initially stored in the sense amplifier 206-2. This operation leaves the data value in the accumulator unchanged (e.g., from Row X).

If the secondary latch of the accumulator contains a "1" (e.g., from Row X), then the result of the AND operation depends on the data value stored in the sense amplifier 206-2 (e.g., from Row Y). The result of the AND operation should be a "1" if the data value stored in the sense amplifier 206-2 (e.g., from Row Y) is also a "1," but the result of the AND operation should be a "0" if the data value stored in the sense amplifier 206-2 (e.g., from Row Y) is a "0." The sensing circuitry 250-2 is configured such that if the dynamic latch of the accumulator contains a "1" (i.e., a voltage corresponding to a "1" on node S2 and a voltage corresponding to a "0"

on node S1), transistor 209-1 does not conduct, the sense amplifier is not coupled to ground (as described above), and the data value previously stored in the sense amplifier 206-2 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206-2, "Deactivate AND" in the pseudo code above indicates that the AND control signal goes low as shown at $t_{12}$ in FIG. 6A, causing pass transistor 207-1 to stop conducting to isolate the sense amplifier 206-2 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal going high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (D_)) shown in FIG. 2A) coupled to the sense amplifier (e.g., 206-2 shown in FIG. 2A) and the behavior of voltage signals on nodes S1 and S2 of the secondary latch of the compute component (e.g., 231-2 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
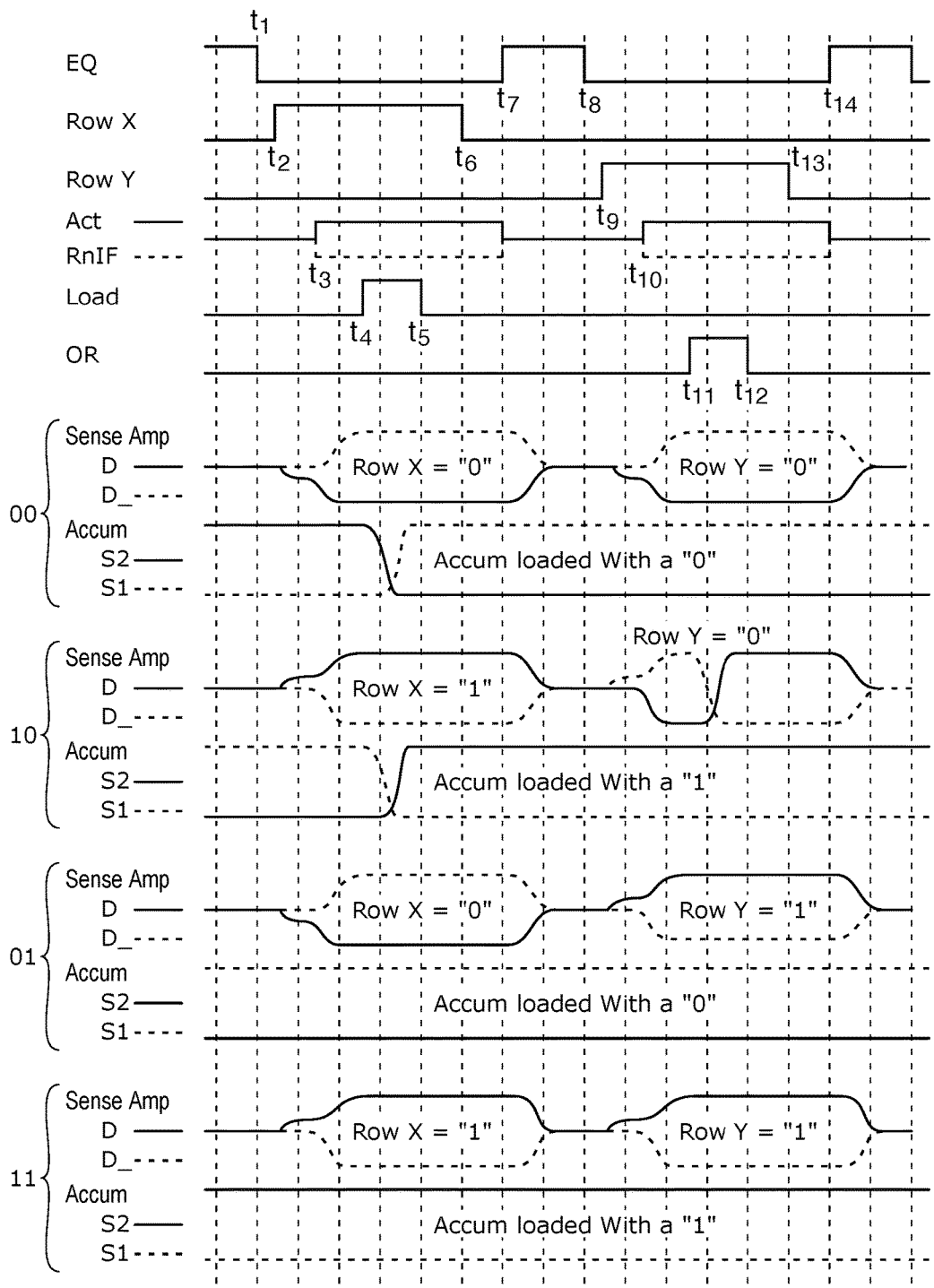

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206-2 and the secondary latch of the compute component 231-2) and the second data value (stored in a memory cell 201-3 coupled to Row Y 204-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

Deactivate EQ;
Open Row Y;
Fire Sense Amps (after which Row Y data resides in the sense amps);
Close Row Y;
When Row Y is closed, the sense amplifier still contains the Row Y data value;
Activate OR;
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data);
If the accumulator contains a "1" (i.e., a voltage corresponding to a "1" on node S2 and a voltage corresponding to a "0" on node S1), the sense amplifier data is written to a "1";
This operation leaves the data in the accumulator unchanged;
Deactivate OR;
Precharge;

The "Deactivate EQ" (shown at is in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231-2 and the second data value (e.g., Row Y) stored in the sense amplifier 206-2, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206-2 (e.g., from Row Y). The result of the OR operation should be a "1" if the data value stored in the sense amplifier 206-2 (e.g., from Row Y) is a "1," but the result of the OR operation should be a "0" if the data value stored in the sense amplifier 206-2 (e.g., from Row Y) is also a "0." The sensing circuitry 250-2 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206-2 is not coupled to ground (either side), and the data value previously stored in the sense amplifier 206-2 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206-2 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206-2 as a result of the OR operation when the secondary latch of the accumulator contains a "1" regardless of the data value previously stored in the sense amp. This operation leaves the data in the accumulator unchanged. FIG. 6B shows, in the alternative, the behavior of voltage signals on the data lines (e.g., 205-1 (D) and 205-2 (D_)) shown in FIG. 2A) coupled to the sense amplifier (e.g., 206-2 shown in FIG. 2A) and the behavior of voltage signals on nodes S1 and S2 of the secondary latch of the compute component 231-2 for an OR logical operation involving each of the possible combination of operands (e.g., Row X/Row Y data values 00, 10, 01, and 11).

After the result of the OR operation is initially stored in the sense amplifier 206-2, "Deactivate OR" in the pseudo code above indicates that the OR control signal goes low as shown at $t_{12}$ in FIG. 6B, causing pass transistor 207-2 to stop conducting to isolate the sense amplifier 206-2 (and data line D 205-2) from ground. If not previously done, Row Y can be closed (as shown at $t_{13}$ in FIG. 6B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250-2 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-2 to conduct and activating the ANDinv control signal causes transistor 214-1 to conduct. In each case, asserting the appropriate inverted control signal can flip the sense amplifier and cause the result initially stored in the sense amplifier 206-2 to be that of the AND operation using the inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206-2. As previously mentioned, activating the ORinv control signal causes transistor 214-2 to conduct and activating the ANDinv control signal causes transistor 214-1 to conduct. The ORinv and/or ANDinv control signals are used in implementing the NOT function, as described in the pseudocode below:

Copy Row X into the Accumulator;
Deactivate EQ;
Open Row X;
Fire Sense Amps (after which Row X data resides in the sense amps);
Activate LOAD (sense amplifier data (Row X) is transferred to nodes S1 and S2 of the Accumulator and resides there dynamically;
Deactivate LOAD;
Activate ANDinv and ORinv (which puts the compliment data value on the data lines);
This results in the data value in the sense amplifier being inverted (e.g., the sense amplifier latch is flipped);
This operation leaves the data in the accumulator unchanged
Deactivate ANDinv and ORinv;
Close Row X;
Precharge;

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above for the AND operation and OR operation. However, rather than closing the Row X and Precharging after the Row X data is loaded into the sense amplifier 206-2 and copied into the dynamic latch, a compliment version of the data value in the dynamic latch of the accumulator can be placed on the data line and thus transferred to the sense amplifier 206-2. This is done by enabling (e.g., causing transistor to conduct) and disabling the invert transistors (e.g., ANDinv and ORinv). This results in the sense amplifier 206-2 being flipped from the true data value that was previously stored in the sense amplifier to a compliment data value (e.g., inverted data value) being stored in the sense amp. As such, a true or compliment version of the data value in the accumulator can be transferred to the sense amplifier based upon activating or not activating ANDinv and/or ORinv. This operation leaves the data in the accumulator unchanged.

Because the sensing circuitry 250-2 shown in FIG. 2A initially stores the result of the AND, OR, and/or NOT logical operations in the sense amplifier 206-2 (e.g., on the sense amplifier nodes), these logical operation results can be communicated easily and quickly to any enabled row, any row activated after the logical operation is complete, and/or into the secondary latch of the compute component 231-2. The sense amplifier 206-2 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206-2 fires.

When performing logical operations in this manner, the sense amplifier 206-2 can be pre-seeded with a data value from the dynamic latch of the accumulator to reduce overall current utilized because the sense amps 206-2 are not at full rail voltages (e.g., supply voltage or ground/reference voltage) when accumulator function is copied to the sense amplifier 206-2. An operation sequence with a pre-seeded sense amplifier 206-2 either forces one of the data lines to the reference voltage (leaving the complementary data line at $V_{DD}/2$, or leaves the complementary data lines unchanged. The sense amplifier 206-2 pulls the respective data lines to full rails when the sense amplifier 206-2 fires. Using this sequence of operations will overwrite data in an enabled row.

A SHIFT operation can be accomplished by multiplexing ("muxing") two neighboring data line complementary pairs using a DRAM isolation (ISO) scheme. According to embodiments of the present disclosure, the shift circuitry 223 can be used for shifting data values stored in memory cells coupled by a particular pair of complementary data lines to the sensing circuitry 250-2 (e.g., sense amplifier 206-2) corresponding to a different pair of complementary data lines (e.g., such as a sense amplifier 206-2 corresponding to a left or right adjacent pair of complementary data lines. As used herein, a sense amplifier 206-2 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized by the following pseudocode follows:

Deactivate Norm and Activate Shift;
Deactivate EQ;
Open Row X;
Fire Sense Amps (after which shifted Row X data resides in the sense amps);
Activate Norm and Deactivate Shift;
Close Row X;
Precharge;

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206-3 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudocode for the AND operation and OR operation. After these operations, the Row X data value for the memory cell coupled to the left adjacent pair of complementary data lines is shifted right and stored in the sense amplifier 206-3.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206-3 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift;
Deactivate EQ;
Open Row X;
Fire Sense Amps (after which Row X data resides in the sense amps);
Deactivate Norm and Activate Shift;
Sense amplifier data (shifted left Row X) is transferred to Row X;
Close Row X;
Precharge;

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206-2 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudocode for the AND operation and OR operation. After these operations, the Row X data value for the memory cell coupled to the pair of complementary data lines corresponding to the sense circuitry 250-2 is stored in the sense amplifier 206-2.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 7:
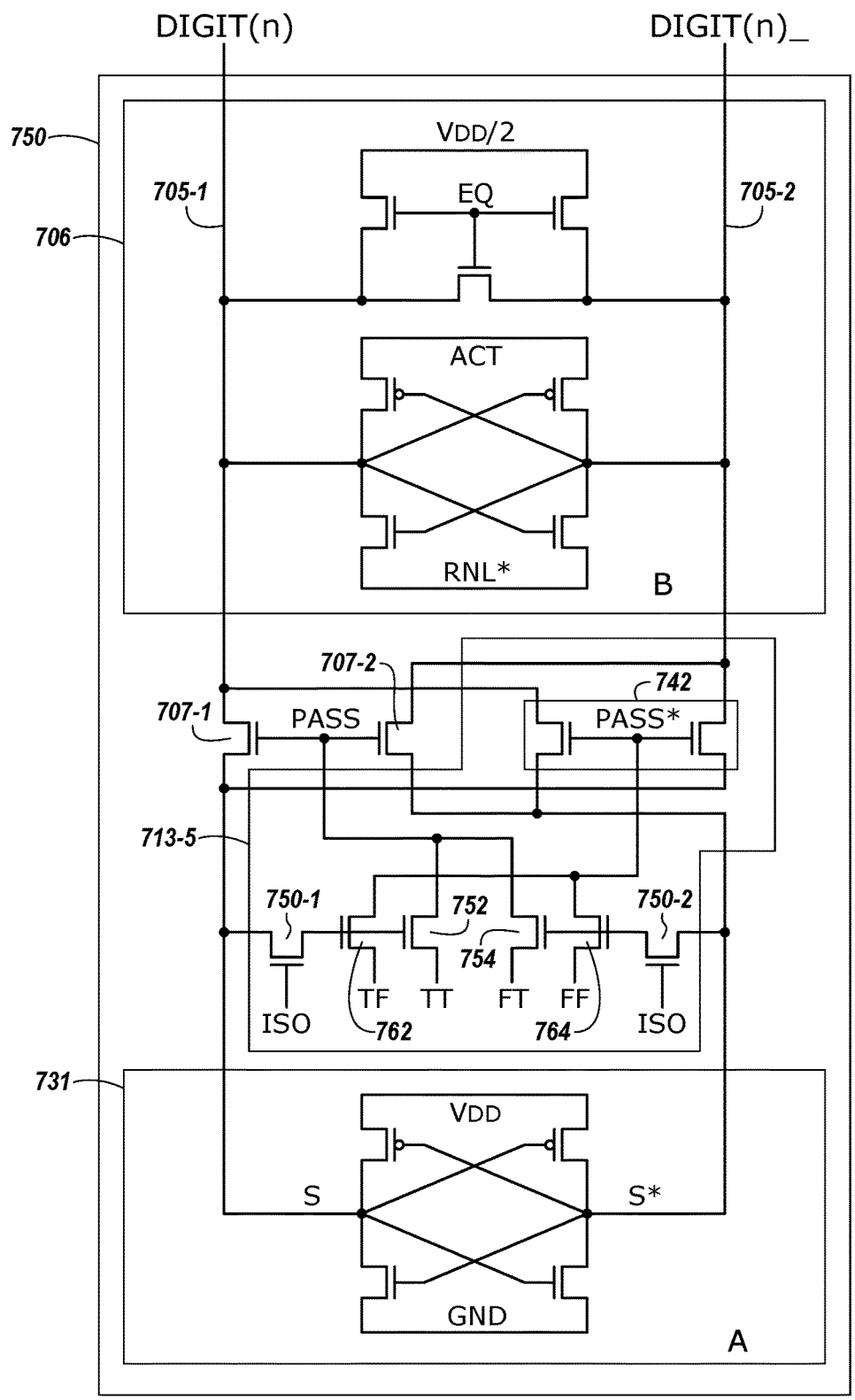
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a sense amplifier 706 coupled to a pair of complementary sense lines 705-1 and 705-2, and a compute component 731 coupled to the sense amplifier 706 via pass gates 707-1 and 707-2. The gates of the pass gates 707-1 and 707-2 can be controlled by a logical operation selection logic signal, PASS, which can be output from logical operation selection logic 713-5. FIG. 7 shows the compute component 731 labeled "A" and the sense amplifier 706 labeled "B" to indicate that the data value stored in the compute component 731 is the "A" data value and the data value stored in the sense amplifier 706 is the "B" data value shown in the logic tables illustrated with respect to FIG. 8.

The sensing circuitry 750 illustrated in FIG. 7 includes logical operation selection logic 713-5. In this example, the logic 713-5 comprises swap gates 742 controlled by a logical operation selection logic signal PASS*. The logical operation selection logic 713-5 also comprises four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line (e.g., 705-1) through isolation transistor 750-1 (having a gate coupled to an ISO signal control line), and gates of logic selection transistors 764 and 754 are coupled to the complementary sense line (e.g., 705-2) through isolation transistor 750-2 (also having a gate coupled to an ISO signal control line).

Logic selection transistors 752 and 754 are arranged similarly to transistor 207-1 (coupled to an AND signal control line) and transistor 207-2 (coupled to an OR signal control line) respectively, as shown in FIG. 2A. Operation of logic selection transistors 752 and 754 are similar based on the state of the TT and FT selection signals and the data values on the respective complementary sense lines at the time the ISO signal is asserted. Logic selection transistors 762 and 764 also operate in a similar manner to control continuity of the swap transistors 742. For example, to OPEN (e.g., turn on) the swap transistors 742, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 742 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 7 are summarized in the logic table illustrated in FIG. 8.

Figure 8:
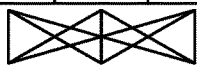
FIG. 8 is a logic table illustrating selectable logic operation results implemented by a sensing circuitry in accordance with a number of embodiments of the present disclosure.

FIG. 8 is a logic table illustrating selectable logic operation results implementable by the sensing circuitry shown in FIG. 7 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 706 and compute component 731. The four control signals, in conjunction with a particular data value present on the complementary sense lines, controls the continuity of the pass gates 707-1 and 707-2 and swap transistors 742, which in turn affects the data value in the compute component 731 and/or sense amplifier 706 before/after firing. The capability to selectably control continuity of the swap transistors 742 facilitates implementing logical operations involving inverse data values (e.g., inverse operands and/or inverse result), among others.

The logic table illustrated in FIG. 8 shows the starting data value stored in the compute component 731 shown in column A at 844, and the starting data value stored in the sense amplifier 706 shown in column B at 845. The other 3 top column headings (NOT OPEN, OPEN TRUE, and OPEN INVERT) in the logic table of FIG. 8 refer to the continuity of the pass gates 707-1 and 707-2, and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "Not Open" column 856 corresponds to the pass gates 707-1 and 707-2 and the swap transistors 742 both being in a non-conducting condition, the "Open True" 870 corresponds to the pass gates 707-1 and 707-2 being in a conducting condition, and the "Open Invert" 871 corresponds to the swap transistors 742 being in a conducting condition. The configuration corresponding to the pass gates 707-1 and 707-2 and the swap transistors 742 both being in a conducting condition is not reflected in the logic table of FIG. 8 since this results in the sense lines being shorted together.

Via selective control of the continuity of the pass gates 707-1 and 707-2 and the swap transistors 742, each of the three columns of the first set of two rows of the upper portion of the logic table of FIG. 8 can be combined with each of the three columns of the second set of two rows below the first set to provide 3×3=9 different result combinations, corresponding to nine different logical operations, as indicated by the various connecting paths shown at 875. The nine different selectable logical operations that can be implemented by the sensing circuitry 750 are summarized in the logic table illustrated in FIG. 8.

The columns of the lower portion of the logic table illustrated in FIG. 8 show a heading 880 that includes the state of logic selection control signals. For example, the state of a first logic selection control signal is provided in row 876, the state of a second logic selection control signal is provided in row 877, the state of a third logic selection control signal is provided in row 878, and the state of a fourth logic selection control signal is provided in row 879. The particular logical operation corresponding to the results is summarized in row 847.

As such, the sensing circuitry shown in FIG. 7 can be used to perform various logical operations as shown in FIG. 8. For example, the sensing circuitry 750 can be operated to perform various logical operations (e.g., AND and OR logical operations) in association with comparing data patterns in memory in accordance with a number of embodiments of the present disclosure.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs, ORs, or SHIFTs in parallel, e.g., concurrently, using data values in memory cells coupled to a data line (e.g., a column of 16K memory cells).

In order to perform these ANDs, ORs, or SHIFTs in parallel, data may need to be horizontally contiguous (e.g., stored in memory cells next to each other) so that calculations of distances between memory cells storing data do not need to be calculated along with the operations being performed. By gathering the data to be horizontally contiguous, the operations can be performed more efficiently. Further, previous approaches included sensing circuits where data is moved out for logical operation processing (e.g., using 32 or 64 bit registers) and included fewer operations being performed in parallel compared to the apparatus of the present disclosure. In this manner, significantly higher throughput is effectively provided along with more efficient use of avoiding transferring data out of the array by insuring the data is stored in such a way to perform operations on the data in parallel. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for gathering data, comprising:
    storing a first element in memory cells coupled to a first sense line and a plurality of access lines;
    storing a second element in memory cells coupled to a second sense line and the plurality of access lines, wherein the memory cells coupled to the first sense line are separated from the memory cells coupled to the second sense line by at least memory cells coupled to a third sense line and the plurality of access lines; and
    transferring the second element from being stored in the memory cells coupled to the second sense line to being stored in the memory cells coupled to the third sense line.

2. The method of claim 1, wherein transferring the second element comprises reorganizing a data unit in a first position of the second element stored in a memory cell coupled to a first of the plurality of access lines and the second sense line to be stored in a memory cell coupled to the first of the plurality of access lines and the third sense line.

3. The method of claim 2, wherein transferring the second element comprises reorganizing a data unit of the second element from being stored in a non-adjacent memory cell to being stored in an adjacent memory cell in relation to a memory cell storing a data unit of the first element.

4. The method of claim 3, wherein the non-adjacent memory cell, the adjacent memory cell, and a memory cell storing a data unit in a first position of the first element are coupled to a same access line.

5. The method of claim 4, wherein:
    the first sense line is adjacent to the third sense line; and
    at least one sense line is between the second sense line and the third sense line.

6. The method of claim 1, comprising:
    storing a third element in memory cells coupled to a fourth sense line and the plurality of access lines; and
    storing the third element in memory cells coupled to a fifth sense line and the plurality of access lines, wherein the fifth sense line is between the third sense line and the second sense line.

7. The method of claim 6, comprising performing a number of iterations of operations including at least one of an AND, an OR, and a SHIFT operation, wherein each iteration corresponds to storing a particular element.

8. The method of claim 7, wherein a first of the number of iterations comprises storing the second element in the third sense line and a second of the number of iterations comprises storing the third element in the fifth sense line.

9. The method of claim 8, wherein a third of the number of iterations comprises reorganizing a fourth element stored in memory cells coupled to a sixth sense line not between the fifth sense line and the second sense line to be stored in memory cells coupled to a seventh sense line that is between the fifth sense line and the second sense line.

10. The method of claim 9, wherein the first sense line is adjacent to the third sense line, the third sense line is adjacent to the fifth sense line, and the fifth sense line is adjacent to the seventh sense line.

11. The method of claim 1, wherein transferring the second element comprises performing at least one of a number of AND, OR, and SHIFT operations without transferring data via an input/output (I/O) line.

12. A method for gathering data, comprising:
    storing a plurality of elements of a memory array, wherein:
        each of the plurality of elements is stored in a respective group of memory cells coupled to a respective sense line and a plurality of access lines; and
        each respective group of memory cells storing an element of the plurality of elements is separated from another group of memory cells storing an additional element of the plurality of elements by additional groups of memory cells, wherein each respective additional group of memory cells is coupled to a sense line and to the plurality of access lines; and
    gathering the plurality of elements by reorganizing the plurality of elements such that a respective element is stored in a respective one of the additional groups of memory cells such that no memory cells are located between the memory cells storing the plurality of elements.

13. The method of claim 12, wherein gathering the plurality of elements comprises reorganizing a first data unit of a first element to be stored in a memory cell adjacent to a memory cell storing a first data unit of a second element.

14. The method of claim 13, wherein the first data unit of the first element is shifted a number of memory cells equal to a distance of memory cells from the first element to the second element minus one and multiplied by an iteration element number, wherein the iteration element number is one.

15. The method of claim 13, wherein gathering the plurality of elements comprises shifting a first data unit of a third element to be stored in a memory cell adjacent to the memory cell storing the first data unit of the first element.

16. The method of claim 15, wherein the first data unit of the third element is shifted a number of positions across memory cells equal to a distance of memory cells from the first element to the third element minus one multiplied by an additional iteration element number, wherein the additional iteration element number if two.

17. An apparatus, comprising:
a first group of memory cells coupled to a first sense line and to a plurality of access lines and configured to store a first element;
a second group of memory cells coupled to a second sense line and to the plurality of access lines, wherein the second sense line is adjacent to the first sense line;
a third group of memory cells coupled to a third sense line and to the plurality of access lines and configured to store a second element; and
a controller configured to operate sensing circuitry to perform a gather operation that includes reorganizing the second element from being stored in the third group of memory cells to being stored in the second group of memory cells.

18. The method of claim 17, wherein the controller is configured to operate the sensing circuitry to perform the reorganizing without transferring data via an input/output (I/O) line.

19. The method of claim 17, wherein the controller is configured to operate the sensing circuitry to perform the reorganizing without firing a column decode line.

20. The method of claim 17, wherein the controller is configured to operate the sensing circuitry to reorganize the plurality of elements by performing a first iteration of operations that shifts the second element a number of columns of memory cells equal to a distance of the number of groups of memory cells between the first element and the second element.

21. The method of claim 20, wherein the controller is configured to operate the sensing circuitry to shift the plurality of elements by performing a second iteration of operations that shifts a third element stored in a group of memory cells coupled to a fourth sense line a number of columns of memory cells equal to a distance from the group of memory cells coupled to the second sense line and the group of memory cells coupled to the fourth sense line.

22. An apparatus, comprising:
a plurality of first groups of memory cells, wherein each group of the plurality of first groups of memory cells is:
coupled to a respective sense line and to a plurality of access lines; and
configured to initially store an element of a plurality of elements;
a plurality of second groups of memory cells wherein:
each group of the plurality of second groups of memory cells is:
adjacent to at least one other group of the plurality of second groups of memory cells; and
between a first of the plurality of first groups of memory cells and a second of the plurality of first groups of memory cells; and
the plurality of second groups includes the first of the plurality of first groups of memory cells; and
a controller configured to operate sensing circuitry to gather elements initially stored in the plurality of first groups of memory cells to be stored in the plurality of second groups of memory cells.

23. The apparatus of claim 22, wherein at least one sense line separates each of the respective sense lines from another of the respective sense lines that are coupled to the group of the plurality of first groups of memory cells.

24. The apparatus of claim 22, wherein the group of memory cells store:
a first data unit of a first element in a memory cell coupled to a consecutively first sense line; and
a first data unit of a second element in a memory cell coupled to a consecutively $N^{th}$ sense line;
wherein memory cells coupled to the consecutively second, third, . . . , $N^{th}-1$ access lines do not store an element and each of the plurality of elements are N−1 data units wide.

25. The apparatus of claim 22, wherein each of the plurality of elements are stored in a group of memory cells coupled to the plurality of access lines and each of the respective sense lines.

* * * * *